US012244972B2

(12) United States Patent
Kunugimoto et al.

(10) Patent No.: US 12,244,972 B2
(45) Date of Patent: Mar. 4, 2025

(54) SUBSTRATE PROCESSING MONITORING APPARATUS BASED ON IMAGING VIDEO DATA, SUBSTRATE PROCESSING APPARATUS, SUBSTRATE PROCESSING MONITORING METHOD, AND STORAGE MEDIUM

(71) Applicant: Tokyo Electron Limited, Tokyo (JP)

(72) Inventors: Yuichiro Kunugimoto, Kumamoto (JP); Keishi Hamada, Kumamoto (JP); Takafumi Hayama, Kumamoto (JP); Motoi Okada, Hokkaido (JP); Shoki Hamaguchi, Hokkaido (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 132 days.

(21) Appl. No.: 17/776,800

(22) PCT Filed: Nov. 4, 2020

(86) PCT No.: PCT/JP2020/041253
§ 371 (c)(1),
(2) Date: May 13, 2022

(87) PCT Pub. No.: WO2021/095612
PCT Pub. Date: May 20, 2021

(65) Prior Publication Data
US 2022/0400232 A1    Dec. 15, 2022

(30) Foreign Application Priority Data
Nov. 15, 2019 (JP) .................... 2019-206954

(51) Int. Cl.
*H04N 7/18* (2006.01)
*B05C 11/00* (2006.01)
(Continued)

(52) U.S. Cl.
CPC ............ *H04N 7/183* (2013.01); *B05C 11/00* (2013.01); *B05C 11/10* (2013.01); *G03F 7/162* (2013.01);
(Continued)

(58) Field of Classification Search
CPC ...... H04N 7/183; H04N 23/69; H04N 23/815; H04N 5/91; G06T 7/0004; G06T 2207/30148
See application file for complete search history.

(56) References Cited

U.S. PATENT DOCUMENTS

| | | | |
|---|---|---|---|
| 2018/0117619 A1* | 5/2018 | Choi | B05C 11/1007 |
| 2018/0275071 A1* | 9/2018 | Choi | G01N 21/8422 |
| 2018/0323095 A1* | 11/2018 | Peh | H01L 21/67265 |

FOREIGN PATENT DOCUMENTS

| | | |
|---|---|---|
| CN | 104916570 A | 9/2015 |
| JP | 2005-073218 A | 3/2005 |

(Continued)

OTHER PUBLICATIONS

International Search Report issued on Jan. 19, 2021 for WO 2021/095612 A1 (4 pages).

*Primary Examiner* — Mohamed A. Wasel
(74) *Attorney, Agent, or Firm* — Venjuris P.C.

(57) ABSTRACT

A monitoring apparatus for a substrate processing apparatus includes: an imaging unit that captures an image of a nozzle of the substrate processing apparatus and a surface of a substrate held by a substrate holder of the substrate processing apparatus; a monitoring data generation unit that generates monitoring video data based on imaging video data captured by the imaging unit during an execution of a substrate process performed by the substrate processing apparatus including a first process and a second process; and a monitoring condition changing unit that changes a generation condition of the monitoring video data during the (Continued)

execution of the substrate process so that at least a resolution or a number of frames of the monitoring video data during an execution of the second process is different from the monitoring video data during an execution of the first process.

20 Claims, 13 Drawing Sheets

(51) Int. Cl.
*B05C 11/10* (2006.01)
*G03F 7/16* (2006.01)
*G06T 7/00* (2017.01)
*H04N 5/91* (2006.01)
*H04N 23/69* (2023.01)
*H04N 23/80* (2023.01)

(52) U.S. Cl.
CPC ............ *G06T 7/0004* (2013.01); *H04N 5/91* (2013.01); *H04N 23/69* (2023.01); *H04N 23/815* (2023.01); *G06T 2207/30148* (2013.01)

(56) References Cited

FOREIGN PATENT DOCUMENTS

| JP | 2015-153903 A | 8/2015 |
| JP | 2017-183493 A | 10/2017 |
| JP | 2019-062007 A | 4/2019 |
| JP | 2019-513275 A | 5/2019 |
| WO | 2016/157330 A1 | 10/2016 |
| WO | 2019/146456 A1 | 8/2019 |

* cited by examiner

FIG. 5

| TIME | PROCESSING CONTENT |
|---|---|
| t1 | LOAD WAFER W |
| t2 | NOZZLE ARRANGEMENT PROCESS |
| t3 | PROCESSING LIQUID SUPPLYING PROCESS |
| t4 | FILM DRYING PROCESS |
| ... | ... |

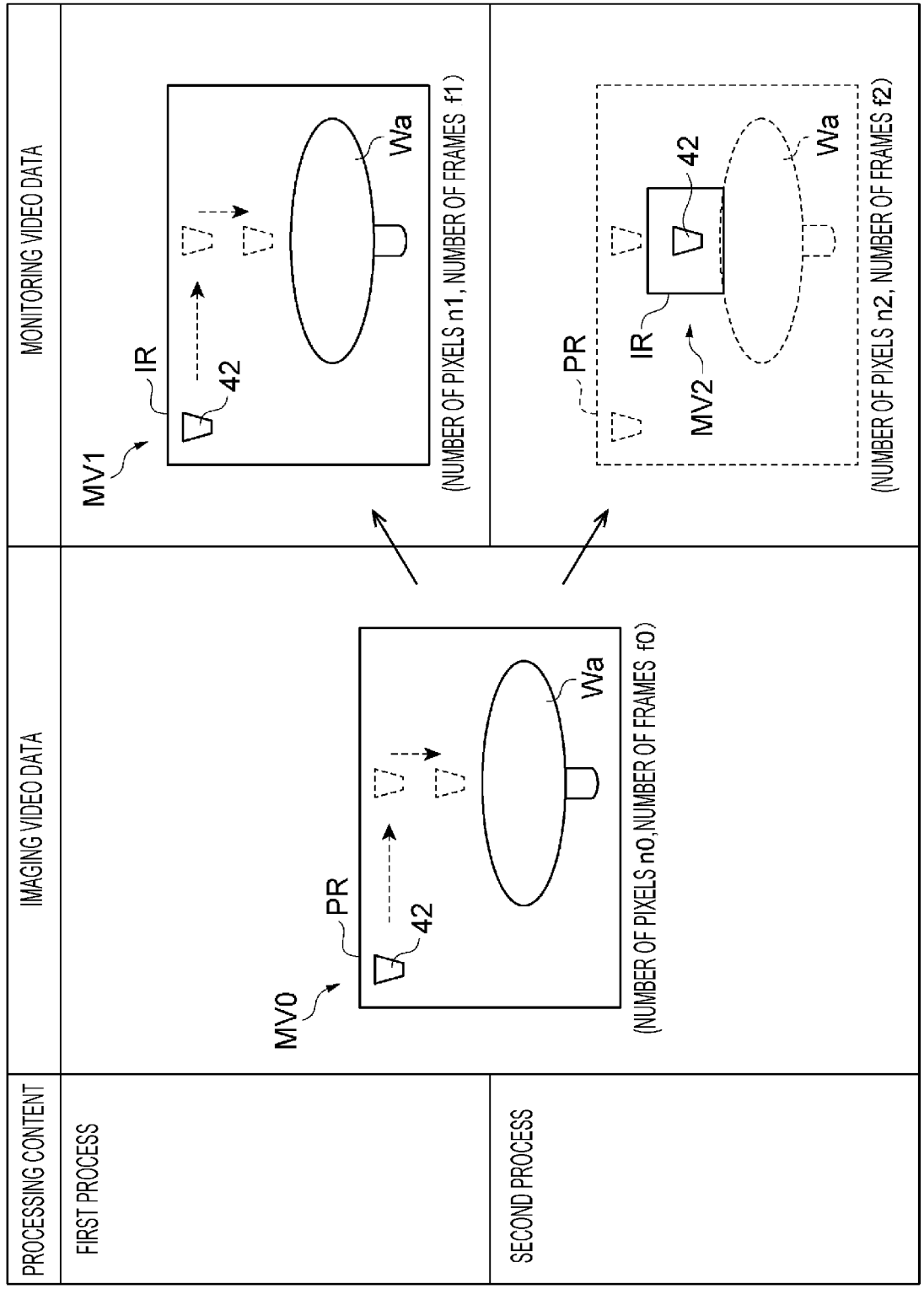

FIG. 8

| CONTENT OF UNIT PROCESS | GENERATION CONDITION | | |
|---|---|---|---|
| | RESOLUTION (NUMBER OF PIXELS) | NUMBER OF FRAMES | TARGET REGION IR |
| NOZZLE ARRANGEMENT PROCESS | n1 | f1 | ENTIRE REGION |
| PROCESSING LIQUID SUPPLYING PROCESS | n2 | f2 | PERIPHERY OF NOZZLE |
| FILM DRYING PROCESS | n1 | f1 | ENTIRE REGION |
| ... | ... | ... | ... |

SUBSTRATE PROCESSING MONITORING APPARATUS BASED ON IMAGING VIDEO DATA, SUBSTRATE PROCESSING APPARATUS, SUBSTRATE PROCESSING MONITORING METHOD, AND STORAGE MEDIUM

CROSS REFERENCE TO RELATED APPLICATIONS

This application is a national phase of PCT application No. PCT/JP2020/041253, filed on 4 Nov. 2020, which claims priority from Japanese patent application No. 2019-206954, filed on 15 Nov. 2019, all of which are incorporated herein by reference.

TECHNICAL FIELD

The present disclosure relates to a monitoring apparatus, a substrate processing apparatus, a monitoring method, and a storage medium.

BACKGROUND

Patent Document 1 discloses a substrate processing apparatus including a liquid nozzle that discharges a processing liquid from a discharge port to a surface of a substrate, an imaging unit that captures an image of the discharge port of the liquid nozzle, and a control unit. The control unit determines whether an abnormality has occurred in a substrate process based on the image captured by the imaging unit.

PRIOR ART DOCUMENT

Patent Document

Patent Document 1: Japanese Patent Laid-Open Publication No. 2015-153903

SUMMARY OF THE INVENTION

Problems to be Solved

The present disclosure provides a monitoring apparatus, a monitoring method, and a storage medium useful for reducing the processing load of a computer when monitoring a substrate process based on imaging video.

Means to Solve the Problems

The monitoring apparatus according to an aspect of the present disclosure is included in a substrate processing apparatus that includes a holding unit configured to hold a substrate and a processing liquid supply unit configured to supply a processing liquid to a surface of the substrate held by the holding unit by discharging the processing liquid from a nozzle. The monitoring apparatus includes: an imaging unit configured to capture an image of the nozzle and the surface of the substrate held by the holding unit; a monitoring data generation unit configured to generate monitoring video data based on the imaging video data captured by the imaging unit during an execution of a substrate process by the substrate processing apparatus including a first process and a second process; and a monitoring condition changing unit configured to change a generation condition of the monitoring video data during the execution of the substrate process so that at least a resolution or a number of frames of the monitoring video data during an execution of the second process is different from the monitoring video data during an execution of the first process.

Effect of the Invention

The present disclosure provides a monitoring apparatus, a monitoring method, and a storage medium useful for reducing the processing load of a computer when monitoring a substrate process based on imaging video.

BRIEF DESCRIPTION OF THE DRAWINGS

FIG. 5 is a table illustrating an example of a processing schedule.

FIG. 6 is a schematic diagram illustrating an example of generation of monitoring video data.

FIG. 8 is a table illustrating an example of the correspondence between a substrate process and a generation condition of the monitoring video data.

DETAILED DESCRIPTION TO EXECUTE THE INVENTION

Hereinafter, embodiments will be described in detail with reference to the accompanying drawings. In the following description, the same elements or elements having the same function are denoted by the same reference symbols, and redundant descriptions thereof are omitted.

[Substrate Processing Apparatus]

First, a schematic configuration of a substrate processing system 1 (substrate processing apparatus) will be described with reference to FIGS. 1 and 2. The substrate processing system 1 is a system that forms a photosensitive film, exposes the photosensitive film, and develops the photosensitive film on a substrate. The substrate to be processed is, for example, a semiconductor wafer W. The photosensitive film is, for example, a resist film. The substrate processing system 1 includes a coating/developing apparatus 2, an exposure apparatus 3, and a control apparatus 100. The exposure apparatus 3 is an apparatus that exposes a resist film (photosensitive film) formed on a wafer W (substrate). Specifically, the exposure apparatus 3 irradiates the exposed portion of the resist film with energy rays for exposure by a method such as an immersion exposure. The coating/developing apparatus 2 performs a process of applying a resist (chemical solution) onto the surface of the wafer W (substrate) to form a resist film before the exposure process by the exposure apparatus 3. Further, the coating/developing apparatus 2 performs a resist film developing process after the exposure process.

(Coating/Developing Apparatus)

Figure 1:
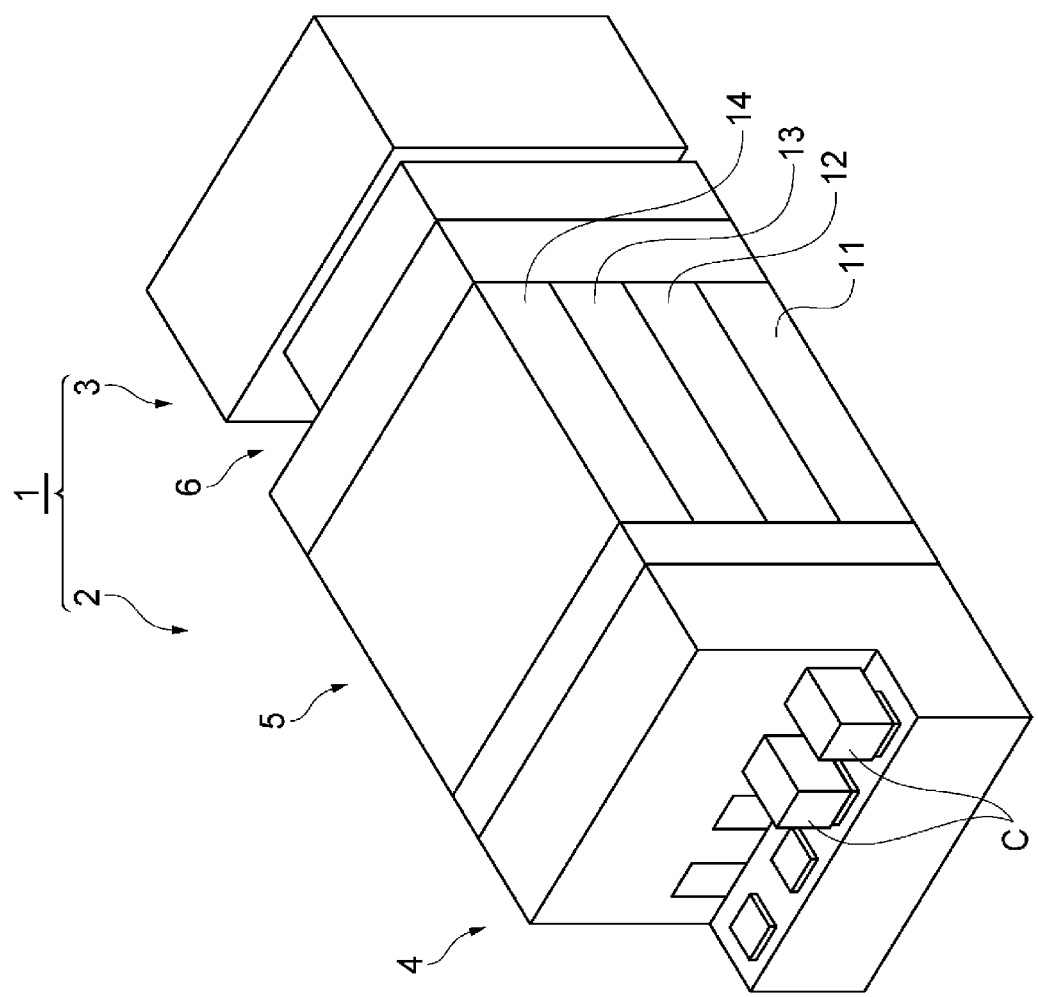
FIG. 1 is a schematic diagram illustrating an example of a substrate processing system according to a first embodiment.
Figure 2:
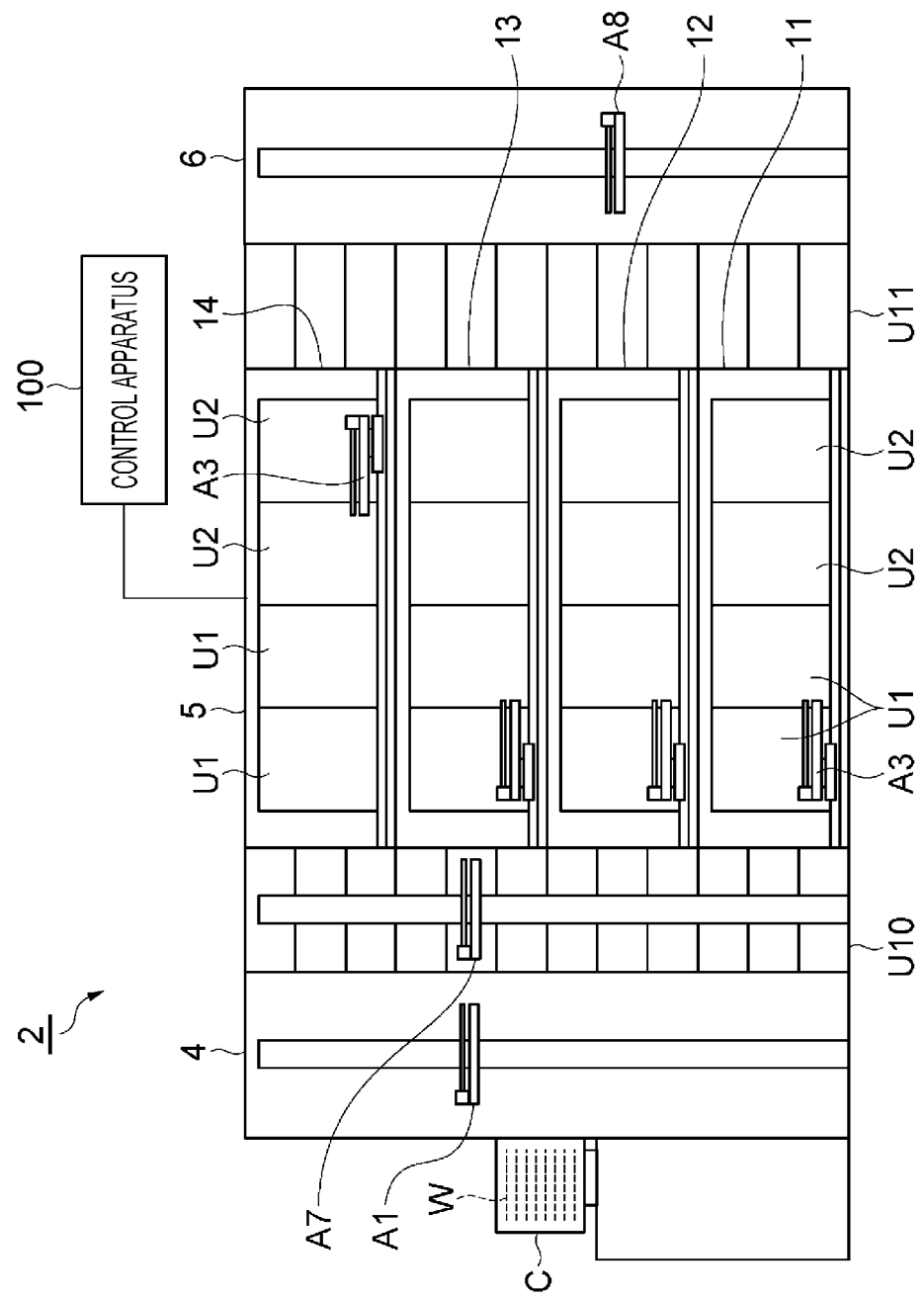
FIG. 2 is a schematic diagram illustrating an example of a coating/developing apparatus.

As illustrated in FIGS. 1 and 2, the coating/developing apparatus 2 (substrate processing apparatus) includes a carrier block 4, a processing block 5, and an interface block 6.

The carrier block 4 introduces the wafer W into the coating/developing apparatus 2 and derives the wafer W from the coating/developing apparatus 2. For example, the carrier block 4 may support a plurality of carriers C for the wafer W, and incorporates a transfer apparatus A1 including a delivery arm. Each of the carriers C accommodates, for example, a plurality of circular wafers W. The transfer apparatus A1 takes out the wafer W from the carrier C, passes the wafer W to the processing block 5, receives the wafer W from the processing block 5, and returns the wafer W to the carrier C. The processing block 5 has a plurality of processing modules 11, 12, 13, and 14.

Each of the processing modules 11 incorporates a liquid processing unit U1, a heat processing unit U2, and a transfer apparatus A3 that transfers the wafer W to the units. The processing module 11 forms an underlayer film on the surface of the wafer W by the liquid processing unit U1 and the heat processing unit U2. The liquid processing unit U1 applies a processing liquid for forming an underlayer film onto the wafer W. The heat processing unit U2 performs various heat processes accompanying the formation of the underlayer film.

Each of the processing modules 12 incorporates a liquid processing unit U1, a heat processing unit U2, and a transfer apparatus A3 that transfers the wafer W to the units. The processing module 12 forms a resist film on the underlayer film by the liquid processing unit U1 and the heat processing unit U2. The liquid processing unit U1 applies a resist onto the underlayer film as a processing liquid for forming a resist film. For example, the liquid processing unit U1 supplies a processing liquid to the surface of the wafer W, and then rotates the wafer W to form a film of the processing liquid on the surface. The heat processing unit U2 performs various heat processes accompanying the formation of the resist film. As a result, a resist film is formed on the surface of the wafer W.

Each of the processing modules 13 incorporates a liquid processing unit U1, a heat processing unit U2, and a transfer apparatus A3 that transfers the wafer W to the units. The processing module 13 forms an upper layer film on the resist film by the liquid processing unit U1 and the heat processing unit U2. The liquid processing unit U1 applies a processing liquid for forming an upper layer film onto the resist film. The heat processing unit U2 performs various heat processes accompanying the formation of the upper layer film.

Each of the processing modules 14 incorporates a liquid processing unit U1, a heat processing unit U2, and a transfer apparatus A3 that transfers the wafer W to the units. The processing module 14 develops the resist film after exposure by the liquid processing unit U1 and the heat processing unit U2. The liquid processing unit U1 rinses the surface of the wafer W in order to wash away the developer. The heat processing unit U2 performs various heat processes accompanying the developing process. Specific examples of the heat process accompanying the developing process include a heat process before the developing process (post exposure bake (PEB)) and a heat process after the developing process (post bake (PB)).

A shelf unit U10 is provided on the carrier block 4 side in the processing block 5. The shelf unit U10 is divided into a plurality of cells arranged in the vertical direction. A transfer apparatus A7 including an elevating arm is provided in the vicinity of the shelf unit U10. The transfer apparatus A7 raises and lowers the wafer W among the cells of the shelf unit U10.

A shelf unit U11 is provided on the interface block 6 side in the processing block 5. The shelf unit U11 is divided into a plurality of cells arranged in the vertical direction.

The interface block 6 delivers the wafer W to and from the exposure apparatus 3. For example, the interface block 6 incorporates a transfer apparatus A8 including a delivery arm and is connected to the exposure apparatus 3. The transfer apparatus A8 passes the wafer W disposed in the shelf unit U11 to the exposure apparatus 3. The transfer apparatus A8 receives the wafer W from the exposure apparatus 3 and returns the wafer W to the shelf unit U11.

(Liquid Processing Unit)

Figure 3:
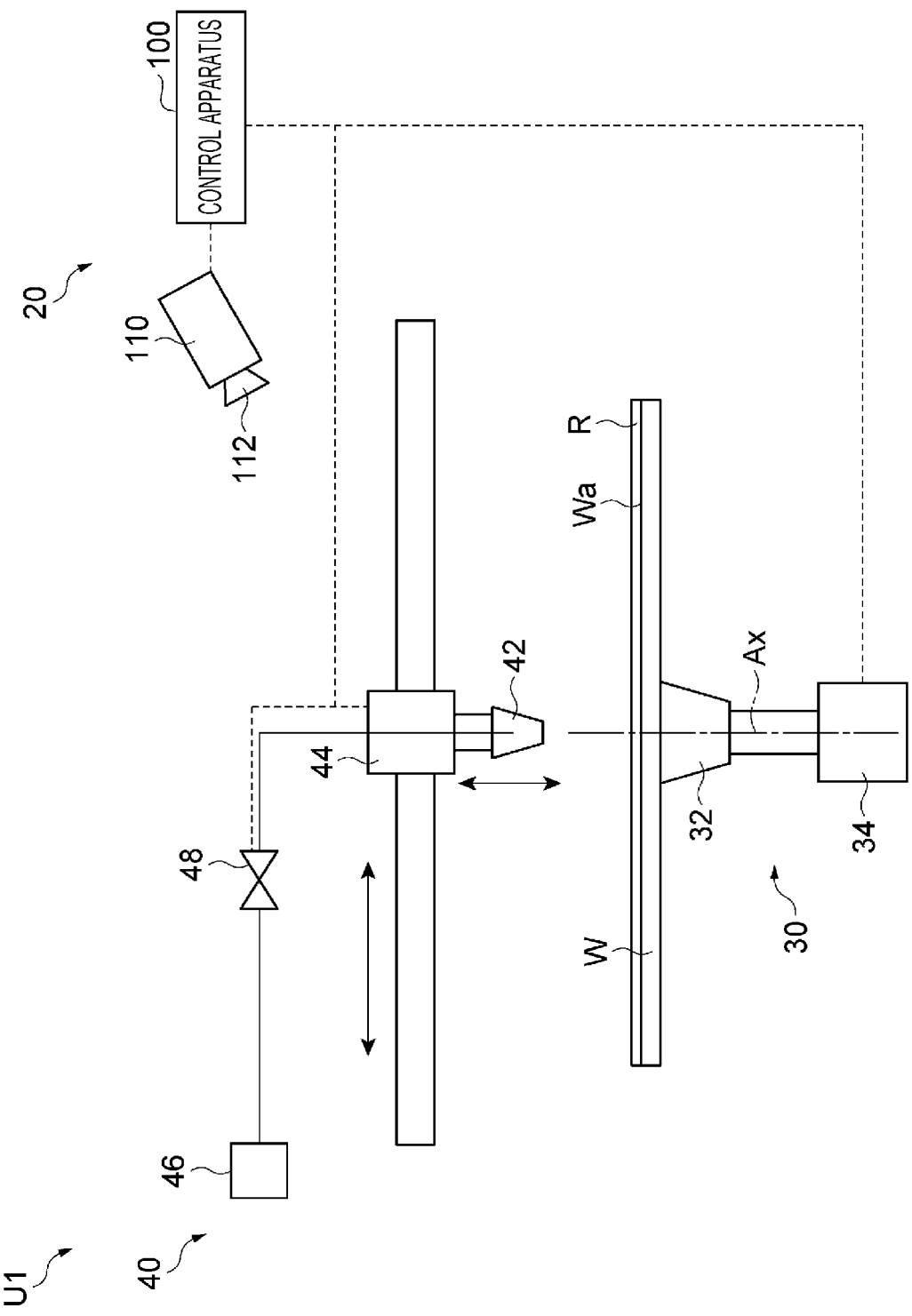
FIG. 3 is a schematic diagram illustrating an example of a liquid processing unit.

Subsequently, an example of the liquid processing unit U1 of the processing module 12 will be described with reference to FIG. 3. As illustrated in FIG. 3, the liquid processing unit U1 includes a rotation holding unit 30 and a processing liquid supply unit 40.

The rotation holding unit 30 holds and rotates the wafer W. The rotation holding unit 30 includes, for example, a holding unit 32 and a rotation drive unit 34. The holding unit 32 supports a central portion of the wafer W disposed horizontally with the surface Wa facing up, and holds the wafer W by, for example, vacuum suction. The rotation drive unit 34 is an actuator including a power source such as an electric motor and rotates the holding unit 32 around the vertical axis Ax. As a result, the wafer W on the holding unit 32 rotates. The holding unit 32 may hold the wafer W so that the center of the wafer W substantially coincides with the axis Ax.

The processing liquid supply unit 40 supplies a processing liquid to the surface Wa of the wafer W. The processing liquid is a solution (resist) for forming the resist film R. The processing liquid supply unit 40 includes a nozzle 42, a source 46, an on-off valve 48, and a nozzle moving mechanism 44. The nozzle 42 discharges the processing liquid onto the surface Wa of the wafer W held by the holding unit 32. For example, the nozzle 42 is disposed above the wafer W and discharges the processing liquid downward. The source 46 supplies the processing liquid to the nozzle 42. The on-off valve 48 is provided in a supply path between the nozzle 42 and the source 46.

The nozzle moving mechanism 44 moves the nozzle 42 between a discharge position above the wafer W and a retraction position away from the discharge position. The discharge position is, for example, vertically above the center of rotation of the wafer W (located on the axis Ax). The standby position is, for example, located outside the peripheral edge of the wafer W and set above the discharge position. In this case, the nozzle moving mechanism 44 includes a horizontal drive unit that moves the nozzle 42 along the surface Wa of the wafer W, and an elevating drive unit that moves the nozzle 42 perpendicular to the surface Wa of the wafer W.

(Control Apparatus)

Figure 4:
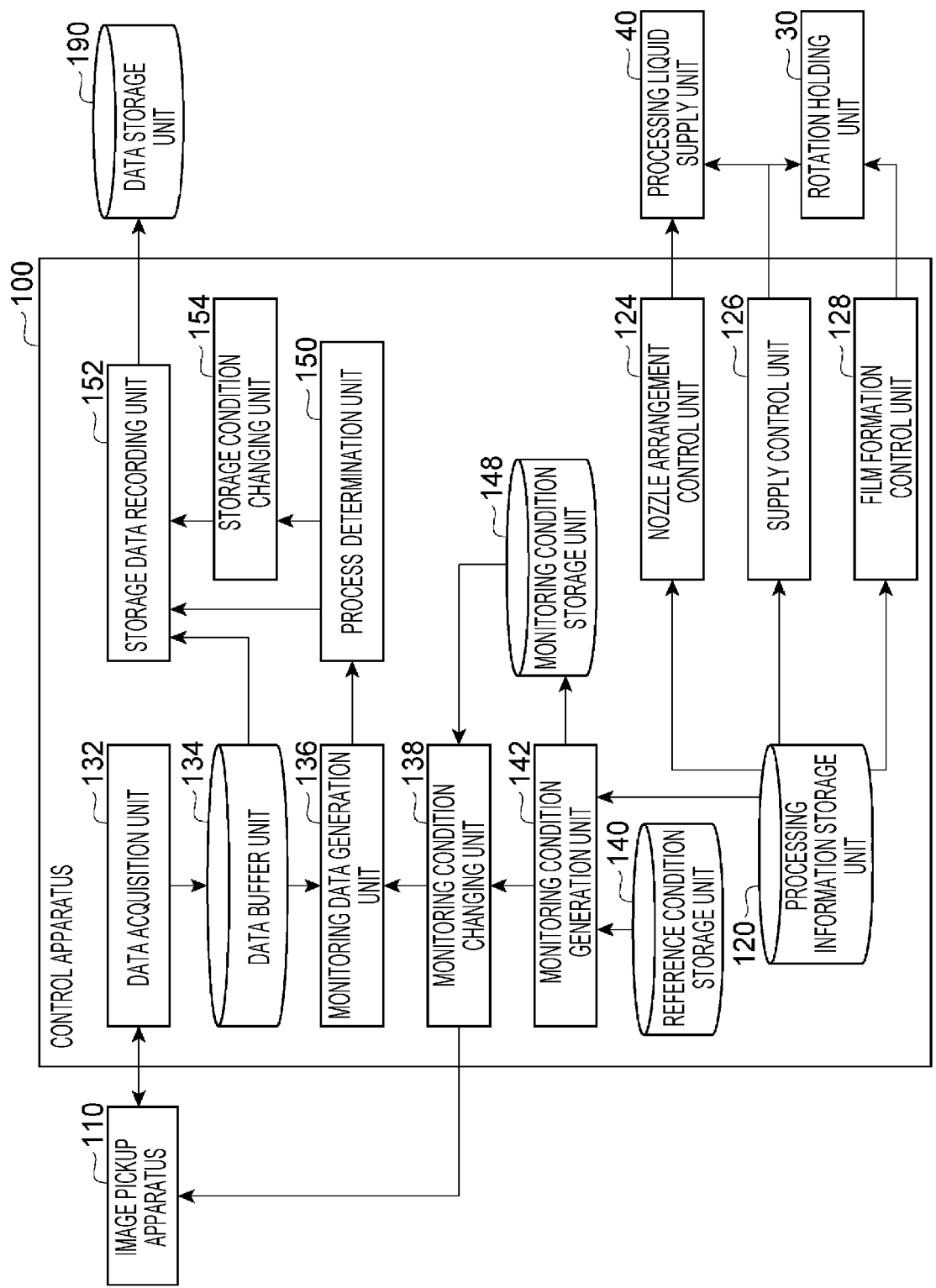
FIG. 4 is a block diagram illustrating an example of a functional configuration of a control apparatus.

The control apparatus 100 causes the coating/developing apparatus 2 to process the wafer W by partially or wholly controlling the coating/developing apparatus 2. The wafer W process (liquid process) performed in the liquid processing unit U1 includes a process of moving the nozzle 42 between the standby position and the discharge position, a process of discharging a processing liquid from the nozzle 42 at the discharge position, and a process of forming a film of the processing liquid on the surface Wa after the processing liquid is supplied. Hereinafter, various processes included in the liquid process performed in the liquid processing unit U1 are referred to as a "unit process." As illustrated in FIG. 4, the control apparatus 100 includes a processing information storage unit 120, a nozzle arrangement control unit 124, a supply control unit 126, and a film formation control unit 128 as a functional configuration (hereinafter, referred to as a "functional module").

The processing information storage unit 120 stores processing information related to the process of the wafer W. The processing information may include a processing schedule of the wafer W by the coating/developing apparatus 2 and processing condition in each unit process. The processing schedule of the wafer W includes a liquid processing schedule in the liquid processing unit U1. For example, as illustrated in FIG. 5, an execution order of the plurality of unit processes included in the liquid process and an execution time of each unit process are defined in the processing schedule of the wafer W. In FIG. 5, the arrangement order from top to bottom indicates the execution order. The processing condition in each unit process includes, for example, a moving speed of the nozzle 42, a discharge amount of the processing liquid, and a rotation speed of the wafer W.

The nozzle arrangement control unit 124 performs a unit process of moving the nozzle 42 in the standby position to the discharge position (hereinafter, referred to as a "nozzle arrangement process") according to the processing schedule stored in the processing information storage unit 120. For example, after moving the nozzle 42 horizontally by the horizontal driving unit of the nozzle moving mechanism 44, the nozzle arrangement control unit 124 disposes the nozzle 42 at the discharge position by moving the nozzle 42 downward by the elevating drive unit of the nozzle moving mechanism 44. Further, the nozzle arrangement control unit 124 performs a unit process of moving the nozzle 42 at the discharge position to the standby position (hereinafter, referred to as a "nozzle retraction process") according to the processing schedule stored in the processing information storage unit 120. For example, after raising the nozzle 42 at the discharge position by the elevating drive unit of the nozzle moving mechanism 44, the nozzle arrangement control unit 124 disposes the nozzle 42 to the standby position by moving the nozzle 42 horizontally by the horizontal drive unit of the nozzle moving mechanism 44. In the nozzle arrangement process and the nozzle retraction process, the nozzle arrangement control unit 124 moves the nozzle 42 in the horizontal direction and the vertical direction at a moving speed according to the processing condition.

The supply control unit 126 performs a unit process in which the processing liquid supply unit 40 supplies the processing liquid to the surface Wa of the wafer W while the rotation holding unit 30 rotates the wafer W (hereinafter, a "supplying process") according to the processing schedule stored in the processing information storage unit 120. For example, the supply control unit 126 starts discharging the processing liquid by switching the on-off valve 48 from the closed state to the open state while rotating the wafer W by the rotation holding unit 30. The supply control unit 126 stops discharging the processing liquid from the nozzle 42 by switching the on-off valve 48 from the open state to the closed state after a predetermined time has elapsed from the start of discharge. In the supplying process, the supply control unit 126 rotates the wafer W by the rotation holding unit 30 at a rotation speed according to the processing condition, and discharges the processing liquid from the nozzle 42 at a discharge amount (discharge amount per unit time) according to the processing condition.

The film formation control unit 128 performs a unit process of drying the film of the processing liquid supplied onto the surface Wa of the wafer W (hereinafter, a "drying process") according to the processing schedule stored in the processing information storage unit 120. For example, the film formation control unit 128 causes the rotation holding unit 30 to continue rotating the wafer W at a predetermined rotation speed for a predetermined period in at least a part of the drying process. In the drying process, the film formation control unit 128 causes the rotation holding unit 30 to rotate the wafer W at a rotation speed according to the processing condition.

(Monitoring Apparatus)

The liquid processing unit U1 further includes an imaging apparatus 110 (imaging unit) for monitoring the state of a liquid process. The control apparatus 100 not only causes the coating/developing apparatus 2 to process the wafer W, but also monitors the process of the wafer W based on the video data obtained by the imaging apparatus 110 (individually monitors a plurality of unit processes). That is, the substrate processing system 1 is provided with a monitoring apparatus 20 including a control apparatus 100 and an imaging apparatus 110. Examples of monitoring the wafer W process include monitoring whether an abnormality has occurred in the unit process of the wafer W and monitoring how much the unit process of the wafer W is progressing.

The imaging apparatus 110 is configured to capture an image of the nozzle 42 and the surface Wa of the wafer W held by the holding unit 32. The imaging apparatus 110 has a camera that captures an image of an imaging region PR including the nozzle 42 and the surface Wa of the wafer W. The camera generates video data (hereinafter, referred to as "imaging video data MV0") by capturing an image of the imaging region PR. As an example, the camera of the imaging apparatus 110 generates imaging video data MV0 in which the image size is an "HD size" and the number of frames (frame rate) is 60 fps. In the HD-sized image, the number of pixels in the horizontal direction is 1280, and the number of pixels in the vertical direction is 720. Hereinafter, the image size including the number of pixels is expressed as the "HD size" (1280 pixels horizontally×720 pixels vertically).

The camera of the imaging apparatus 110 is provided above the inside of the housing of the liquid processing unit U1, for example, so that the imaging region PR may be captured. In at least a part of the period of the wafer W process, the imaging region PR by the imaging apparatus 110 may be set to include a nozzle 42 located at the discharge position, a nozzle 42 located at the standby position, a nozzle 42 that moves between the discharge position and the standby position, and the entire surface Wa of the wafer W. Alternatively, during the execution of the wafer W process, the imaging region PR by the imaging apparatus 110 may be fixed to a region including the nozzle 42 in the above three states and the entire surface Wa of the wafer W. The imaging apparatus 110 outputs the generated imaging video data MV0 to the control apparatus 100.

As functional modules, the control apparatus 100 further includes, for example, a data acquisition unit 132, a data buffer unit 134, a monitoring data generation unit 136, a monitoring condition changing unit 138, a reference condition storage unit 140, a monitoring condition generation unit 142, a monitoring condition storage unit 148, a process determination unit 150, a storage data recording unit 152, and a storage condition changing unit 154.

The data acquisition unit 132 causes the imaging apparatus 110 to acquire the imaging video data MV0 of the imaging region PR. The data acquisition unit 132 may cause the imaging apparatus 110 to acquire the imaging video data MV0 having a predetermined resolution and number of frames (number of frames per unit time). The resolution is a measure indicating the precision of an image and indicates the magnitude of an amount of information included per unit length (unit area). That is, the size of the imaging region PR (or the angle of view) included in one pixel differs depending on the resolution. When the resolution is high, the size of the imaging region PR per pixel becomes smaller, and when the resolution is low, the size of the imaging region PR per pixel becomes larger.

When the imaging region PR is fixed within a certain range during the execution of the wafer W process, the resolution is determined according to the number of pixels per unit area in the imaging region PR. Hereinafter, a case will be illustrated where the imaging region PR is fixed to a certain range during the execution of the wafer W process. Further, the number of pixels per unit area of the imaging region PR of the imaging video data MV0 will be described as a "number of pixels n0," and the number of frames of the imaging video data MV0 will be described as a "number of frames f0." When the imaging region PR is fixed to a certain range, the resolution may be represented by the image size of video data. For example, in the HD size (1280 pixels horizontally×720 pixels vertically), the VGA size (640 pixels horizontally×480 pixels vertically), and the QVGA size (320 pixels horizontally×240 pixels vertically), the image size becomes larger and the resolution becomes higher in this order. When using these image sizes, depending on the purpose of monitoring, recording, and display, the aspect ratio of the image size may be standardized by performing a process such as cutting out a part of the region or adding a black band.

The data buffer unit 134 temporarily stores the imaging video data MV0 acquired by the data acquisition unit 132. For example, the data buffer unit 134 stores the imaging video data MV0 for a predetermined capacity. As an example, the capacity that may be stored in the data buffer unit 134 is set to such that the imaging video data MV0 in the process for several wafers W (liquid process in the liquid processing unit U1) may be stored. The data buffer unit 134 may store new imaging video data MV0 by deleting old data of the imaging video data MV0 so that the capacity does not exceed the set value.

The monitoring data generation unit 136 generates monitoring video data based on the imaging video data MV0 by the imaging apparatus 110 during the execution of the wafer W process. The monitoring data generation unit 136 generates monitoring video data by, for example, performing a predetermined process on the imaging video data MV0 temporarily stored by the data buffer unit 134. The monitoring data generation unit 136 may generate monitoring video data by compressing the imaging video data MV0 in at least a part of the period during which the wafer W process is being executed. That is, the monitoring video data may be data in which the imaging video data MV0 is compressed. The monitoring data generation unit 136 reduces at least the resolution or the number of frames to compress the imaging video data MV0. For example, the monitoring data generation unit 136 may reduce the resolution without changing the number of frames of the imaging video data MV0, may reduce the number of frames without changing the resolution, and may reduce the number of frames and the resolution. As an example, the monitoring data generation unit 136 may lower the resolution by changing (compressing) the HD-sized imaging video data MV0 to the VGA-sized or QVGA-sized video data.

The monitoring condition changing unit 138 changes the generation condition of the monitoring video data during the execution of the wafer W process. The monitoring data generation unit 136 generates monitoring video data according to the generation condition changed (set) by the monitoring condition changing unit 138. The monitoring condition changing unit 138 set the generation condition in the first process and the generation condition in the second process so that the generation conditions are different from each other in a unit process (hereinafter, referred to as a "first process") included in the wafer W process and the other unit process (hereinafter, referred to as a "second process"). For example, the monitoring condition changing unit 138 changes the generation condition during the execution of the wafer W process so that at least the resolution or the number of frames of the monitoring video data during the execution of the second process (hereinafter, referred to as "second video data MV2") is different from that of the monitoring video data during the execution of the first process (hereinafter, referred to as "first video data MV1").

For example, the monitoring condition changing unit 138 changes the reduction rate in the number of pixels per unit area from the imaging video data MV0 during the execution of the wafer W process so that the resolution of the second video data MV2 is different from that of the first video data MV1. In this case, the monitoring data generation unit 136 generates monitoring video data by reducing the number of pixels from the imaging video data MV0 according to the reduction rate in the number of pixels per unit area changed by the monitoring condition changing unit 138. As an example, the monitoring condition changing unit 138 changes the generation condition so that the reduction rate in the number of pixels per unit area during execution of the first process is n1/n0, and changes the generation condition so that the reduction rate in the number of pixels per unit area during execution of the second process is n2/n0. "n1" and "n2" are positive integers of n0 or less, respectively, and "n1" and "n2" are different values from each other. When explaining the change of the image size, in a case where the HD size is changed to the VGA size, the reduction rate is halved in the horizontal pixel ratio. In a case where the HD size is changed to the QVGA size, the reduction rate is 1/4 in the horizontal pixel ratio. When reducing the number of pixels, the number of pixels may be reduced by any method such as a thinning method or a method of calculating an average value, and any method in the related art may be used as an image processing algorithm for reducing the number of pixels.

The monitoring condition changing unit 138 may change the reduction rate in the number of frames from the imaging video data MV0 during the execution of the wafer W process so that the number of frames of the second video data MV2 is different from that of the first video data MV1. In this case, the monitoring data generation unit 136 generates monitoring video data by reducing the number of frames from the imaging video data MV0 according to the reduction rate in the number of frames changed by the monitoring condition changing unit 138. As an example, the monitoring condition changing unit 138 changes the generation condition so that the reduction rate in the number of frames during execution of the first process is f1/f0, and changes the generation condition so that the reduction rate in the number of frames during execution of the second process is f2/f0. "f1" and "f2" are positive integers of f0 or less, respectively, and "f1" and "f2" are different values from each other. When the monitoring condition changing unit 138 changes the number of pixels and the number of frames per unit area as described above, the monitoring data generation unit 136 generates the first video data having the number of pixels n1 the number of frames f1, and the second video data having the number of pixels n2 the number of frames f2. When reducing the number of pixels, the number of frames may be reduced by any method such as a thinning method or a method of calculating an average value, and any method in the related art may be used as a processing algorithm for reducing the number of frames.

The monitoring condition changing unit 138 may change the generation condition during the execution of the wafer W process so that the size of the imaging region of all pixels of the second video data MV2 during the execution of the second process is different from that of the first video data MV1 during the execution of the first process. For example, the monitoring condition changing unit 138 changes a region which the monitoring data generation unit 136 includes in the monitoring video data among the imaging video data MV0 (hereinafter, referred to as a "target region IR"). The monitoring condition changing unit 138 changes the generation condition during the execution of the wafer W process so that the target region IR in the second video data MV2 is different from the target region IR in the first video data MV1. Hereinafter, an example of changing the generation condition will be described by exemplifying several processing contents.

When the first process is a process of arranging the nozzle 42 and the second process is a process of supplying the processing liquid, the monitoring condition changing unit 13 changes the generation condition during the execution of the wafer W process so that the resolution of the second video data MV2 during the execution of the second process is higher than that of the first video data MV1 during the execution of the first process. The number of frames of the second video data MV2 generated in this case may be the same as the number of frames of the first video data MV1 or may be larger than the number of frames of the first video data MV1. The monitoring condition changing unit 138 changes the generation condition during the execution of the wafer W process so that the target region IR in the second video data MV2 is narrower than the target region IR in the first video data MV1.

As an example, as illustrated in FIG. 6, the monitoring condition changing unit 138 matches the target region IR of the first video data MV1 in the nozzle arrangement process with the imaging region PR of the imaging video data MV0. That is, the size of the imaging region in all pixels of the first video data MV1 is defined as the entire imaging region PR. As an example, the image size of the imaging video data MV0 is the HD size, and the image size of the first video data MV1 is the VGA size. In this case, as one of the conditions for generating the first video data MV1, the reduction rate in resolution may be set to 1/2 based on the number of horizontal pixels, the reduction rate in resolution may be set to 2/3 based on the number of vertical pixels, or the aspect ratio may be standardized. The monitoring condition changing unit 138 selects a part including the nozzle 42 and its periphery from the imaging region PR as the target region IR of the second video data MV2 in the supplying process. That is, the size of the imaging region in all pixels of the second video data MV2 is made smaller than that of the imaging region PR.

The monitoring condition changing unit 138 does not change the number of pixels n2 per unit area even when the target region IR is narrowed down to the periphery of the nozzle. For example, the image of the second video data MV2 corresponds to an image obtained by cutting out the target region IR from the imaging video data MV0 whose image size is HD size (an image cut out not to include a region other than the target region IR). The size of the imaging region PR included in all pixels of the second video data MV2 is different from the size of the imaging region PR included in all pixels of the first video data MV1. Specifically, the target region IR of the second video data MV2 is smaller than the target region IR of the first video data MV1. As a result, even when the second video data MV2 has a high resolution, an increase in the data size of the second video data MV2 is suppressed.

Similarly, when the first process is a drying process and the second process is a process of supplying the processing liquid, the monitoring condition changing unit 13 changes the generation condition during the execution of the wafer W process so that the resolution of the second video data MV2 is higher than the resolution of the first video data MV1. The number of frames of the second video data MV2 generated in this case may be the same as the number of frames of the first video data MV1 or may be larger than the number of frames of the first video data MV1. The monitoring condition changing unit 138 changes the generation condition during the execution of the wafer W process so that the target region IR in the second video data MV2 is narrower than the target region IR in the first video data MV1. As an example, the monitoring condition changing unit 138 matches the target region IR of the first video data MV1 in the drying process with the imaging region PR of the imaging video data MV0. The monitoring condition changing unit 138 selects a part including the nozzle 42 and its periphery from the imaging region PR as the target region IR of the second video data MV2 in the supplying process.

The reference condition storage unit 140 stores correspondence information in which the processing content of the wafer W and the generation condition of the monitoring video data are associated with each other. The reference condition storage unit 140 stores, for example, table information in which the content of each unit process of the wafer W and the generation condition according to the content of each unit process are associated with each other. As an example, as illustrated in FIG. 8, the reference condition storage unit 140 stores table information in which the content of the unit process of the wafer W, the resolution (the number of pixels per unit area), the number of frames, and the target region IR are associated with each other.

The monitoring condition generation unit 142 generates a condition changing schedule for changing the generation condition of the monitoring video data based on the processing schedule of the wafer W and the correspondence information. For example, the monitoring condition generation unit 142 acquires the processing schedule of the wafer W by referring to the processing information storage unit 120. Then, the monitoring condition generation unit 142 changes a condition changing schedule for determining the generation condition for each unit process included in the processing schedule by referring to the table information in which the processing content stored in the reference condition storage unit 140 and the generation condition are associated with each other.

The monitoring condition storage unit 148 stores a condition changing schedule for changing the generation condition of the imaging video data according to the processing schedule of the wafer W by the coating/developing apparatus 2. For example, the monitoring condition storage unit 148 stores the condition changing schedule generated by the monitoring condition generation unit 142. The monitoring condition changing unit 138 may change the generation condition during the execution of the wafer W process based on the condition changing schedule. The monitoring data generation unit 136 generates monitoring video data by performing a predetermined process on the imaging video data MV0 according to the generation condition changed by the monitoring condition changing unit 138.

As an example, when the monitoring condition changing unit 138 changes the resolution of the generation condition to the resolution n1 based on the condition changing schedule, the monitoring data generation unit 136 generates the VGA-sized monitoring video data from the HD-sized imaging video data MV0. When the monitoring condition changing unit 138 changes the resolution of the generation condition to the resolution n2 based on the condition changing schedule, the monitoring data generation unit 136 generates the HD-sized monitoring video data. Alternatively, when the generation condition is changed to the resolution n1, the monitoring data generation unit 136 may generate QVGA-sized monitoring video data, and when the generation condition is changed to the resolution n2, the monitoring data generation unit 136 may generate VGA-sized video data. As another example, when the number of frames in the generation condition is changed to the number of frames f1, the monitoring data generation unit 136 may generate the monitoring video data of 30 fps from the imaging video data MV0 of 60 fps, and when the number of frames in the generation condition is changed to the number of frames f2, the monitoring data generation unit 136 may generate monitoring video data of 60 fps. Alternatively, when the generation condition is changed to the number of frames f1, the monitoring data generation unit 136 may generate the monitoring video data of 15 fps from the imaging video data of 60 fps, and when the generation condition is changed to the number of frames f2, the monitoring data generation unit 136 may generate the monitoring video data of 30 fps.

The process determination unit 150 determines the state of unit process of the wafer W based on the monitoring video data generated by the monitoring data generation unit 136. For example, the process determination unit 150 (abnormality determination unit) determines an abnormality in the unit process of the wafer W based on the monitoring video data. The process determination unit 150 may determine the presence/absence of an abnormality in the process by performing an image process on the monitoring video data according to the content of the unit process. As an example, the process determination unit 150 may determine an abnormality in the unit process of the wafer W based on a difference between the monitoring video data prepared in advance (hereinafter, referred to as "reference video data") and the monitoring video data generated by the monitoring data generation unit 136. The reference video data may be prepared in either format of a video or a still image as long as such data may be compared with each frame of the monitoring video data in chronological order.

Further, the process determination unit 150 may determine the presence/absence of an abnormality in the unit process by inputting the monitoring video data generated by the monitoring data generation unit 136 into a learning model that outputs the presence/absence of an abnormality in response to the input of the monitoring video data. The learning model is generated in advance by machine learning (e.g., deep learning) conducted based on the teacher data which is accumulated by associating the monitoring video data with the determination result of the presence/absence of an abnormality. Based on such a learning model, it is expected that the presence/absence of an abnormality may be discriminated even when the presence/absence of an abnormality may not be discriminated by human eyes only from the image alone. For example, even when the presence/absence of an abnormality may not be discriminated only from the image due to the influence of disturbance such as a diffused reflection caused by the uneven pattern on the surface Wa of the wafer W, the presence/absence of the abnormality may be discriminated.

The process determination unit 150 determines whether there is an abnormality in the process of arranging the nozzle 42. Targets for abnormality determination in the process of arranging the nozzle 42 may include, for example, whether liquid dripping has occurred in the moving nozzle 42, and whether droplets have fallen from the moving nozzle 42. In the determination of the process of arranging the nozzle 42, high image quality is not required, but the region to be monitored is relatively wide. In the present specification, the phrase "image quality" means the precision (fineness) of the video that correlates with at least the resolution or the number of frames of the video data. The phrase "high image quality" may mean the resolution of the video data is high (the imaging region per pixel is small), that the number of frames of the video data is large, or that the resolution of the video data is high and the number of frames is large.

Figure 7A:
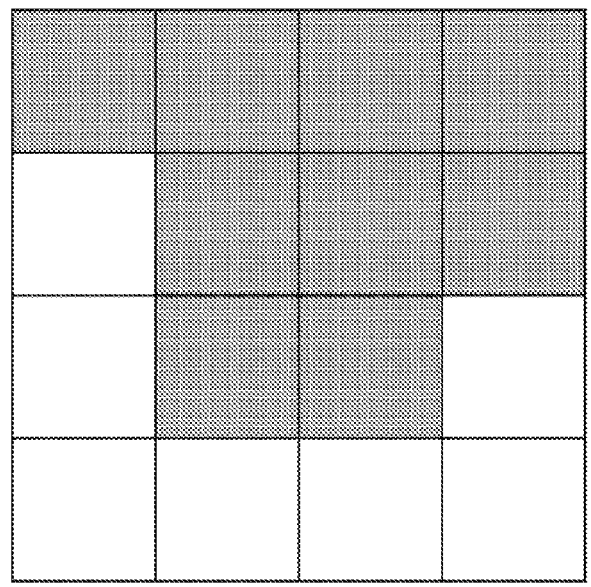
FIGS. 7A and 7B are schematic diagrams illustrating a difference in resolution.
Figure 7B:
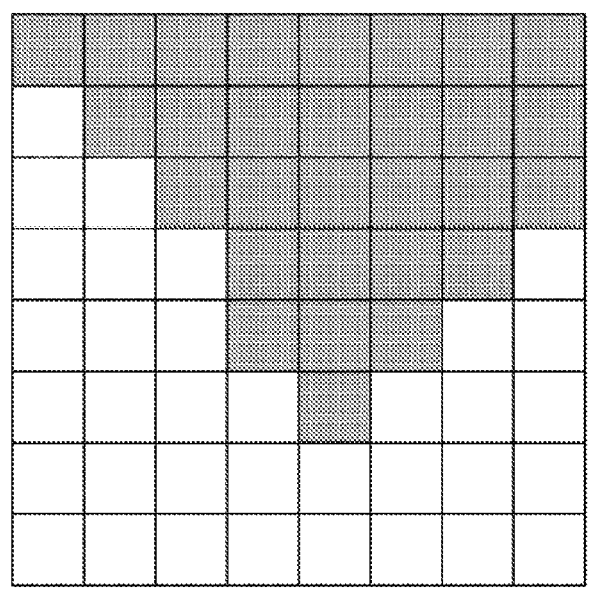

The process determination unit 150 determines whether there is an abnormality in the supplying process. Examples of targets for abnormality determination in the processing liquid supplying process include whether the processing liquid discharged from the nozzle 42 has splashed, whether the processing liquid in the nozzle 42 being discharged has bubbles, whether droplets have fallen from the nozzle 42 immediately after the end of discharge, and whether the arrangement position of the nozzle 42 is appropriate. A relatively high image quality is required for the determination in the supplying process of the processing liquid, but the region to be monitored may be relatively narrow. FIG. 7A schematically illustrates a part of an image of the nozzle 42 when the first video data MV1 has a low image quality, and FIG. 7B schematically illustrates a part of an image of the nozzle 42 when the second video data MV2 has a high image quality. In the image illustrated in FIG. 7B, the size of a part of the nozzle 42 included in one pixel becomes smaller than that of the image illustrated in FIG. 7A, and a contour shape of the nozzle 42 becomes finer as a whole. Therefore, a more detailed image analysis of the processing content becomes possible by using video data of high image quality.

The process determination unit 150 determines whether there is an abnormality in the drying process. Examples of the target of the abnormality determination of the drying process include a determination of whether the spread of a film is appropriate and whether the progress of drying of the film is appropriate. High image quality is not required to determine the drying process, but the region to be monitored is relatively wide.

The storage data recording unit 152 records the storage video data based on the imaging video data. For example, the storage data recording unit 152 performs a predetermined process on the imaging video data MV0 stored in the data buffer unit 134 to generate storage video data, and outputs the generated storage video data to an external data storage unit 190. The control apparatus 100 may include a data storage unit 190. The storage data recording unit 152 may generate storage video data according to preset reference storage conditions. The reference storage condition defines the compression rate from the imaging video data. As an example, the compression rate is determined by at least the resolution (the number of pixels per unit area) or the number of frames.

When the determination result by the process determination unit 150 indicates that the unit process of the wafer W is abnormal, the storage condition changing unit 154 changes the storage condition of the storage video data to a time when the storage video data is recorded. The storage condition changing unit 154 may change at least one of the resolution, the number of frames, and the compression format of the storage video data to a time when the storage video data is recorded. For example, when a signal (hereinafter, referred to as an "abnormal signal") indicating that the unit process of the wafer W is abnormal is received from the process determination unit 150, the storage condition changing unit 154 changes the storage condition of the storage video data during the period in which the unit process when the signal is received is executed. Specifically, the storage condition changing unit 154 changes the storage condition from the reference storage condition to the storage condition at the time of abnormality. The storage condition at the time of abnormality is predetermined. The storage condition at the time of abnormality is defined, for example, so that at least one of the resolution and the number of frames defined by the storage condition at the time of abnormality becomes larger than the corresponding value of the reference storage condition. When the process determination unit 150 does not output an abnormal signal, the storage data recording unit 152 generates storage video data according to the reference storage condition. Meanwhile, when the process determination unit 150 outputs an abnormal signal, the storage video data is generated according to the storage condition at the time of abnormality changed (set) by the storage condition changing unit 154. As a result, when an abnormality occurs, storage video data of high image quality is recorded.

As an example, the resolution may be set to the resolution n1 under the reference storage condition, and the resolution may be changed to the resolution n2 under the storage condition at the time of abnormality. When the storage condition is set to the resolution n1, the storage data recording unit 152 may generate VGA-sized storage video data from HD-sized imaging video data MV0. When the storage condition is changed to the resolution n2, the storage data recording unit 152 may generate HD-sized storage video data. Alternatively, when the storage condition is the resolution n1, the storage data recording unit 152 generates QVGA-sized storage video data from the HD-sized imaging video data MV0, and when the storage condition is the resolution n2, the storage data recording unit 152 may generate VGA-sized storage video data.

As another example, the number of frames may be set to the number of frames f1 under the reference storage condition, and the number of frames may be changed to the number of frames f2 under the storage condition at the time of abnormality. When the storage condition is set to the number of frames f1, the storage data recording unit 152 may generate storage video data having the number of frames of 30 fps from the imaging video data MV0 having the number of frames of 60 fps. When the storage condition is set to the number of frames f2, the storage data recording unit 152 may generate storage video data of 60 fps having the same number of frames as the imaging video data MV0. When the storage condition is set to the number of frames f1, the storage data recording unit 152 may generate storage video data having the number of frames of 15 fps from the imaging video data MV0 having the number of frames of 60 fps. When the storage condition is set to the number of frames f2, the storage data recording unit 152 may generate storage video data having the number of frames of 30 fps.

The compression format (compression coding algorithm) of data may be included in the storage condition of the storage video data. For example, when it is desired to save storage video data having a relatively high image quality in the event of an abnormality, the storage data recording unit 152 may generate storage video data by a reversible coding algorithm (a reversible compression method, e.g., HuffYUV). When it is desired to save storage video data having a relatively low image quality in normal times without any abnormality, the storage data recording unit 152 may generate storage video data by an irreversible coding algorithm (an irreversible compression method, e.g., H264). In the event of an abnormality, the storage data recording unit 152 may change two or more of the resolution, the number of frames, and the compression format of the storage video data to a time when the storage video data is stored.

When the determination result by the process determination unit 150 indicates that the unit process is abnormal, the storage data recording unit 152 may also record processing information indicating the content of the unit process of the wafer W determined to be abnormal. For example, the storage data recording unit 152 acquires processing information related to the unit process to be recorded from the process determination unit 150, and outputs (records) the processing information to the external data storage unit 190 together with the storage video data. Examples of the processing information include individual information of the wafer W to be processed, the content of the unit process when an abnormality occurs, processing condition during execution of the unit process, and measurement information from various sensors.

Figure 9:
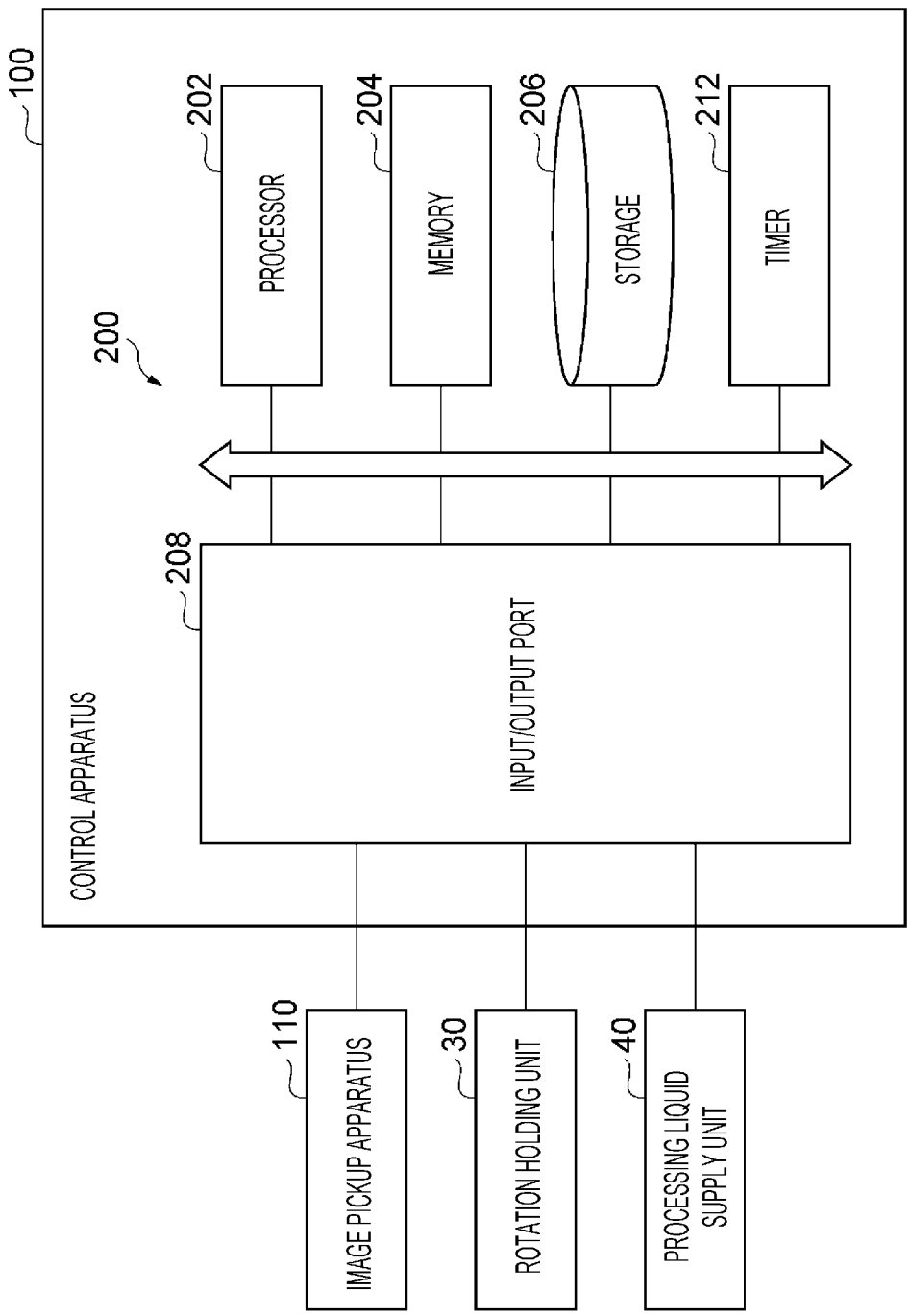
FIG. 9 is a block diagram illustrating an example of a hardware configuration of the control apparatus.

The control apparatus 100 is constituted by one or a plurality of control computers. For example, the control apparatus 100 includes a circuit 200 illustrated in FIG. 9. The circuit 200 includes one or more processors 202, a memory 204, a storage 206, an input/output port 208, and a timer 212. The storage 206 includes a storage medium that is readable by a computer, such as a hard disk. The storage medium stores a program for causing the control apparatus 100 to execute the monitoring procedure (to be described later). The storage medium may be a removable medium such as a non-volatile semiconductor memory, a magnetic disk, or an optical disk. The memory 204 temporarily stores the program loaded from the storage medium of the storage 206 and the calculation result obtained by the processor 202. The processor 202 constitutes each of the above-mentioned functional modules by executing the above program in cooperation with the memory 204. The input/output port 208 inputs/outputs an electric signal to/from the imaging apparatus 110, the rotation holding unit 30, and the processing liquid supply unit 40 according to a command from the processor 202. The timer 212 measures the elapsed time by counting, for example, a reference pulse having a fixed cycle.

When the control apparatus 100 is constituted by a plurality of control computers, each functional module may be implemented by an individual control computer. The control apparatus 100 may be constituted by a control computer including a functional module for executing the unit process of the wafer W by the coating/developing apparatus 2, and a control computer including a functional module for monitoring the process of the wafer W and recording storage video data. Alternatively, each of the functional modules may be implemented by a combination of two or more control computers. In these cases, the plurality of control computers may be communicatively connected to each other, and the monitoring procedures (to be described later) may be executed in cooperation with each other. The hardware configuration of the control apparatus 100 is not necessarily limited to constituting each functional module by a program. For example, each functional module of the control apparatus 100 may be constituted by a dedicated logic circuit or an application specific integrated circuit (ASIC) in which the logic circuit is integrated.

[Substrate Processing Procedure]

Subsequently, a substrate processing procedure executed in the substrate processing system 1 will be described as an example of a substrate processing method. The control apparatus 100 controls the substrate processing system 1 to execute a substrate process including the coating/developing process by, for example, the following procedure. First, the control apparatus 100 controls a transfer apparatus A1 to transfer the wafer W in a carrier C to a shelf unit U10, and controls the transfer apparatus A7 to dispose the wafer W in the cell for a processing module 11.

Subsequently, the control apparatus 100 controls a transfer apparatus A3 to transfer the wafer W of the shelf unit U10 to a liquid processing unit U1 and a heat processing unit U2 in the processing module 11. Further, the control apparatus 100 controls the liquid processing unit U1 and the heat processing unit U2 to form an underlayer film on the surface Wa of the wafer W. After that, the control apparatus 100 controls the transfer apparatus A3 to return the wafer W on which the underlayer film is formed to the shelf unit U10, and controls a transfer apparatus A7 to dispose the wafer W in the cell for a processing module 12.

Subsequently, the control apparatus 100 controls the transfer apparatus A3 to transfer the wafer W of the shelf unit U10 to a liquid processing unit U1 and a heat processing unit U2 in the processing module 12. Further, the control apparatus 100 controls the liquid processing unit U1 and the heat processing unit U2 to form a resist film R on the underlayer film of the wafer W. An example of the liquid processing procedure performed in the liquid processing unit U1 will be described later. After that, the control apparatus 100 controls the transfer apparatus A3 to return the wafer W to the shelf unit U10, and controls the transfer apparatus A7 to dispose the wafer W in the cell for a processing module 13.

Subsequently, the control apparatus 100 controls the transfer apparatus A3 to transfer the wafer W of the shelf unit U10 to each unit in the processing module 13. Further, the control apparatus 100 controls the liquid processing unit U1 and the heat processing unit U2 to form an upper layer film on the resist film R of the wafer W. After that, the control apparatus 100 controls the transfer apparatus A3 to transfer the wafer W to the shelf unit U11.

Subsequently, the control apparatus 100 controls a transfer apparatus A8 to send the wafer W accommodated in the shelf unit U11 to an exposure apparatus 3. In the exposure apparatus 3, an exposure process is then performed on the resist film R formed on the wafer W. After that, the control apparatus 100 receives the wafer W subjected to the exposure process from the exposure apparatus 3, and controls the transfer apparatus A8 to dispose the wafer W in the cell for a processing module 14 in the shelf unit U11.

Subsequently, the control apparatus 100 controls the transfer apparatus A3 to transfer the wafer W of the shelf unit U11 to the heat processing unit U2 of the processing module 14. The control apparatus 100 also controls execution of the developing process and the heat process accompanying the developing process. This completes the coating/developing process.

(Liquid Processing Procedure)

Figure 10:
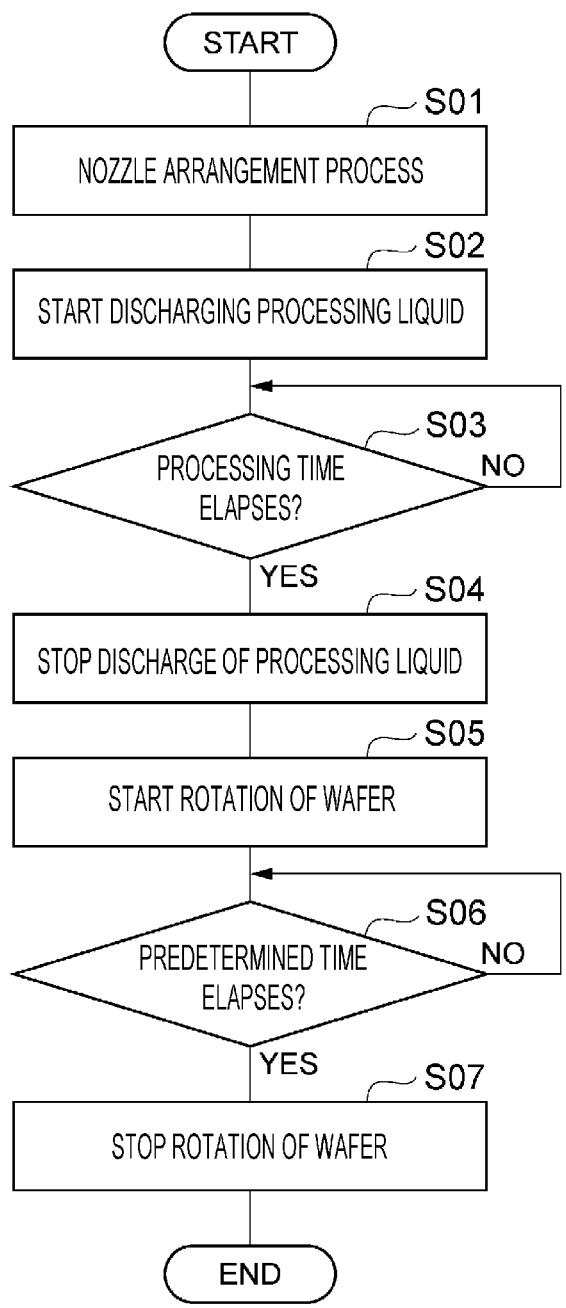
FIG. 10 is a flow chart illustrating an example of a liquid processing procedure.

Subsequently, an example of a liquid processing procedure will be described with reference to FIG. 10. FIG. 10 is a flow chart illustrating an example of the liquid processing procedure executed in the liquid processing unit U1 of the processing module 12. First, the control apparatus 100 executes step S01 in a state where the nozzle 42 is disposed in the standby position and the wafer W is disposed on the rotation holding unit 30 (holding unit 32). In step S01, the nozzle arrangement control unit 124 executes a nozzle arrangement process of moving the nozzle 42 from the standby position to the discharge position by the nozzle moving mechanism 44.

Subsequently, the control apparatus 100 executes steps S02, S03, and S04. In step S02, for example, the supply control unit 126 starts discharging the processing liquid. Specifically, while rotating the wafer W by the rotation holding unit 30, the supply control unit 126 starts discharging the processing liquid by switching the on-off valve 48 from the closed state to the open state. In step S03, the supply control unit 126 waits for a lapse of the processing time of the supplying process from the start of the supplying process while continuing the rotation of the wafer W and the discharge of the processing liquid by the rotation holding unit 30 and the processing liquid supply unit 40, respectively. In step S04 after the lapse of the processing time, the supply control unit 126 stops discharging the processing liquid by, for example, switching the on-off valve 48 from the open state to the closed state.

Subsequently, the control apparatus 100 executes steps S05, S06, and S07. In step S05, for example, a film formation control unit 128 starts the rotation of the wafer W to form a film of the processing liquid. The film formation control unit 128 may adjust the rotation of the wafer W by the rotation holding unit 30 so that the rotation speed at the time of stopping the discharge in step S04 becomes the rotation speed for film formation. In step S06, for example, the film formation control unit 128 waits for a lapse of the processing time of the drying process from the start of rotation of the wafer W for film formation. In step S07 after the lapse of the processing time of the drying process, for example, the film formation control unit 128 stops the rotation of the wafer W by the rotation holding unit 30. The control apparatus 100 (nozzle arrangement control unit 124) may execute a nozzle retraction process at a timing that overlaps with at least a part of the period in which steps S05 to S07 are executed. This completes the liquid processing procedure for one wafer W.

[Monitoring Procedure]

Figure 11:
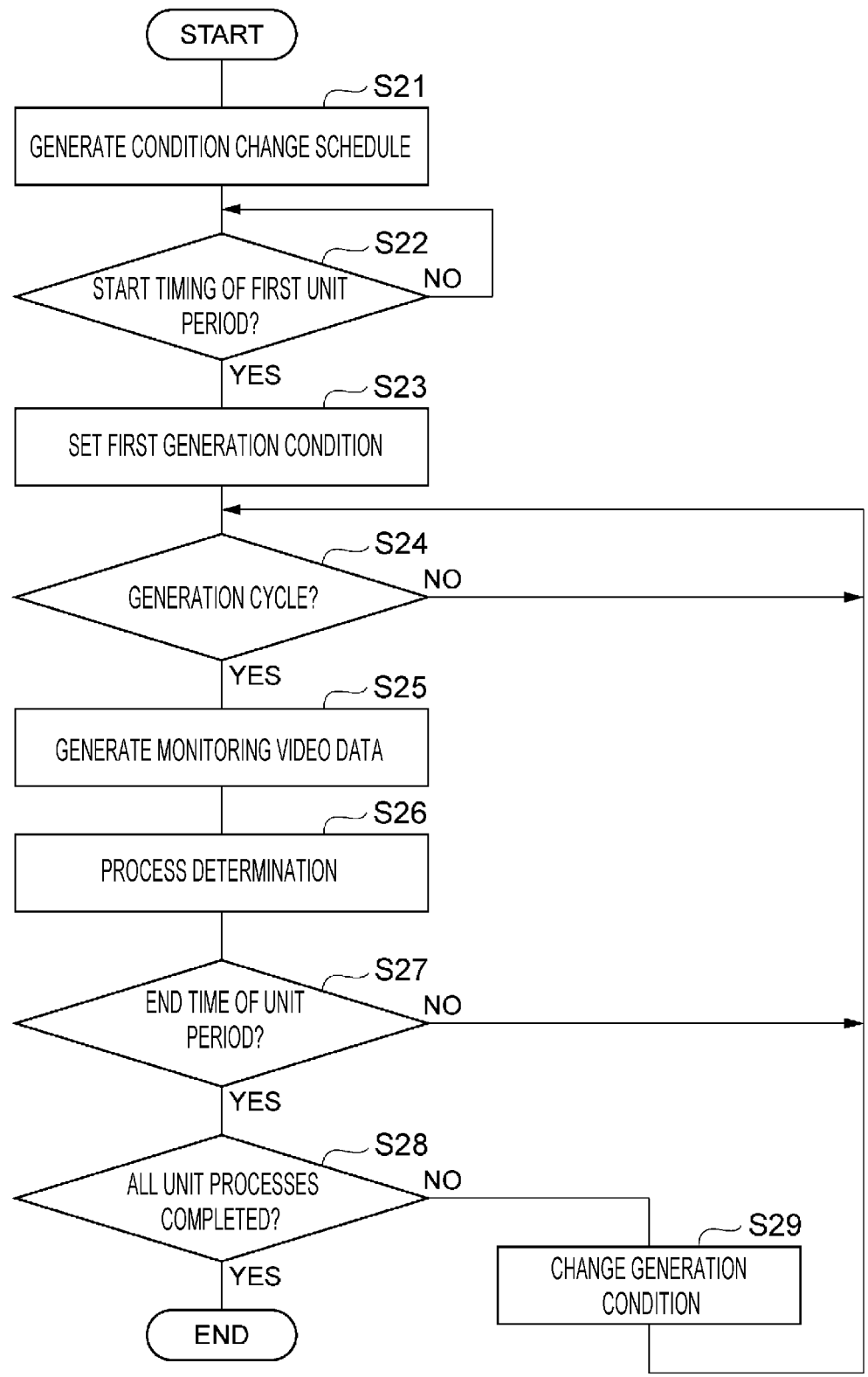
FIG. 11 is a flow chart illustrating an example of a monitoring procedure.

FIG. 11 is a flow chart illustrating an example of a monitoring procedure (monitoring method) by the control apparatus 100. The control apparatus 100 executes a monitoring process of the wafer W process at substantially the same timing as (in parallel with) the execution of the liquid processing procedure. The control apparatus 100 first executes step S21 in a state where the wafer W is loaded into the liquid processing unit U1 and the imaging region PR is continuously captured by the imaging apparatus 110. In step S21, for example, the monitoring condition generation unit 142 generates a condition changing schedule in the wafer W process by referring to the processing schedule stored in the processing information storage unit 120 and the correspondence information stored in the reference condition storage unit 140. The condition changing schedule includes, for example, the order of a plurality of unit periods corresponding to the plurality of unit processes, and the generation condition in each unit period.

Subsequently, the control apparatus 100 executes steps S22 and S23. In step S22, for example, the control apparatus 100 waits until the start timing of the first unit period is reached. In step S23, for example, the monitoring condition change unit 138 sets a generation condition of the monitoring video data according to the content of the unit process based on the condition changing schedule. As an example, when the unit process is a nozzle arrangement process, the monitoring condition changing unit 138 sets the number of pixels per unit area included in the generation condition to the number of pixels n1 (e.g., the image size is set to the VGA size), sets the number of frames to the number of frames f1 (e.g., 30 fps), and sets the target region IR of the monitoring video data to the entire imaging region PR. As a result, the monitoring data generation unit 136 generates monitoring video data during the execution of the nozzle arrangement process according to the generation condition changed by the monitoring condition changing unit 138 during the execution of the nozzle arrangement process.

Subsequently, the control apparatus 100 executes steps S24 and S25. In step S24, for example, the monitoring data generation unit 136 waits until the cycle for generating the monitoring video data is reached. As an example, when the reduction rate in the number of frames is set to 1/2 in the generation condition of the unit process, the timing at which imaging video data MV0 (e.g., imaging video data in which the image size is HD size and the number of frames is 60 fps) is obtained by two frames, becomes the generation cycle. In step S25, the monitoring data generation unit 136 generates one frame of monitoring video data (image data) by compressing the resolution from the imaging video data MV0 according to the resolution (the number of frames per unit area) determined by the generation condition changed by the monitoring condition changing unit 138. As a result of reducing the number of frames or compressing the resolution, monitoring video data (e.g., video data in which the image size is VGA size and the number of frames is 30 fps) is generated.

Subsequently, the control apparatus 100 executes step S26. In step S26, for example, the process determination unit 150 determines whether an abnormality has occurred in the unit process based on the monitoring video data (one frame of monitoring video data generated in step S25) during the execution of the unit process.

Subsequently, the control apparatus 100 executes step S27. In step S27, for example, the control apparatus 100 determines whether the end time of the unit process has been reached. When it is determined that the end time of the unit process has not been reached, the control apparatus 100 repeats the processes of steps S24 to S27. As a result, it is determined whether there is an abnormality in the unit process for each generation cycle of the monitoring video data (for each frame of the monitoring video data).

When it is determined that the end time of the unit process has been reached, the control apparatus 100 executes step S28. In step S28, for example, the control apparatus 100 determines whether the monitoring process in all unit processes has been completed. When it is determined that the monitoring process in all unit processes has not been completed, the control apparatus 100 executes step S29. In step S29, the monitoring condition change unit 138 changes the generation condition of the monitoring video data during the execution of the supplying process based on the condition changing schedule. For example, in a case where the supplying process is monitored after the nozzle arrangement process is completed, while the supply control unit 126 is executing the supplying process, the monitoring condition changing unit 138 changes the number of pixels per unit area from the number of pixels n1 to the number of pixels n2, changes the number of frames from the number of frames f2 to the number of frames f1, and changes the target region IR of the monitoring video data from the entire imaging region PR to the peripheral region of the nozzle 42. Then, by repeating steps S24 to S27, the monitoring data generation unit 136 generates monitoring video data during the execution of the supplying process (e.g., video data in which the image size is the HD size and the number of frames is 60 fps) according to the generation condition changed by the monitoring condition changing unit 138 during the execution of the supplying process.

Further, in a case where the drying process is performed after the supplying process is completed, in step S29, while the film formation control unit 128 is executing the drying process, the monitoring condition changing unit 138 changes the number of pixels per unit area from the number of pixels n2 to the number of pixels n1, changes the number of frames from the number of frames f2 to the number of frames f1, and changes the target region IR of the monitoring video data from the peripheral region of the nozzle 42 to the entire imaging region PR. Then, by repeating steps S24 to S27, the monitoring data generation unit 136 generates monitoring video data during the execution of the drying process (e.g., video data in which the image size is VGA size and the number of frames is 30 fps) according to the generation condition changed by the monitoring condition changing unit 138 during the execution of the drying process.

Meanwhile, when it is determined in step S28 that the monitoring process in all unit processes has been completed, the monitoring procedure of the unit process in one wafer W is completed.

[Recording Procedure]

Figure 12:
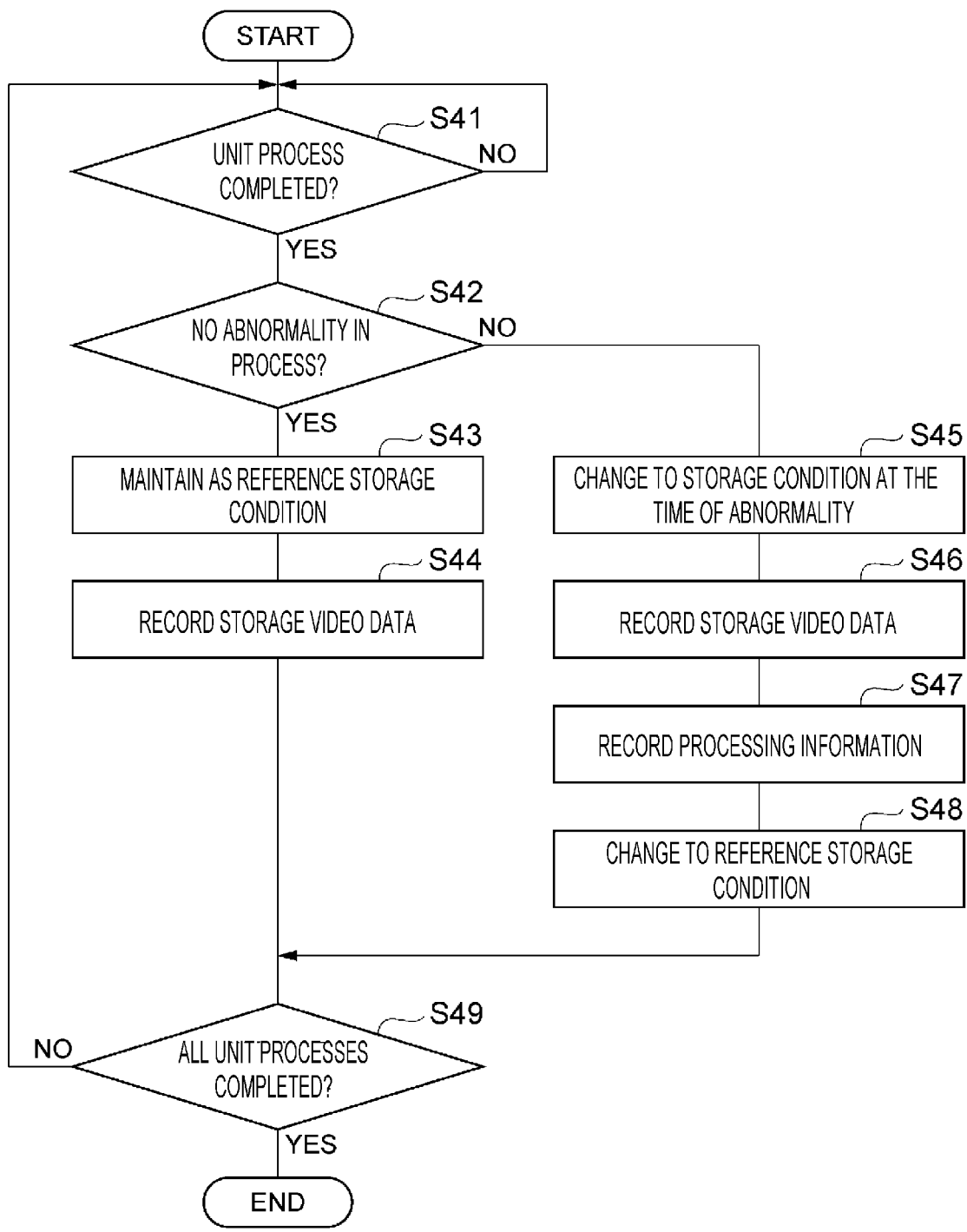
FIG. 12 is a flow chart illustrating an example of a recording procedure.

FIG. 12 is a flow chart illustrating a recording procedure (storing procedure) of storage video data. The control apparatus 100 executes a recording process for processing the wafer W in accordance with the execution of the liquid processing procedure and the monitoring procedure. As an example, the control apparatus 100 records storage video data in the unit process immediately after the completion of each unit process of the nozzle arrangement process, the supplying process, and the drying process. The control apparatus 100 first executes step S41 in a state where the imaging region PR is continuously captured by the imaging apparatus 110. In step S41, for example, the control apparatus 100 waits until the unit process to be recorded is completed.

When the unit process of the recording target is completed, the control apparatus 100 executes step S42. In step S42, for example, the process determination unit 150 determines whether a processing abnormality has been determined in the unit process of the recording target.

When it is determined in step S42 that there is no abnormality in the unit process of the recording target, the control apparatus 100 executes steps S43 and S44. In step S43, for example, the storage condition changing unit 154 maintains the storage condition of the storage video data as a reference storage condition (e.g., the image size is maintained at the VGA size and the number of frames is maintained at 30 fps). In step S44, for example, the storage data recording unit 152 generates storage video data in the unit process of the recording target from the imaging video data MV0 temporarily stored in the data buffer unit 134 according to the reference storage condition. The storage data recording unit 152 outputs, for example, the generated storage video data to a data storage unit 190 outside the control apparatus 100.

Meanwhile, when it is determined in step S42 that there is an abnormality in the unit process of the recording target, the control apparatus 100 executes steps S45 to S47. In step S45, for example, the storage condition changing unit 154 changes the storage condition of the storage video data from the reference storage condition to the storage condition at the time of abnormality (e.g., the image size is changed to the HD size and the number of frames is changed to 60 fps). In step S46, for example, the storage data recording unit 152 generates storage video data in the unit process of the recording target from the imaging video data MV0 temporarily stored in the data buffer unit 134 according to the storage condition at the time of abnormality. The storage data recording unit 152 outputs, for example, the generated storage video data to the data storage unit 190 outside the control apparatus 100. In step S47, for example, the storage data recording unit 152 acquires processing information related to the unit process of the recording target from the process determination unit 150, and outputs (records) the processing information to (in) the external storage unit together with the storage video data.

Subsequently, the control apparatus 100 executes step S48. In step S48, for example, the storage condition changing unit 154 changes the storage condition of the storage video data from the storage condition at the time of abnormality to the reference storage condition. As a result, when no abnormality has occurred in the unit process that is the next recording target, the recording data for storage is recorded according to the reference storage condition.

Subsequently (after the completion of step S44 or step S48), the control apparatus 100 executes step S49. In step S49, for example, the control apparatus 100 determines whether the recording process in all unit processes has been completed. When it is determined that the recording process in all unit processes has not been completed, the control apparatus 100 repeats the processes of steps S41 to S49 so that the recording process in the next unit process is executed. Meanwhile, when it is determined in step S49 that the recording process in all unit processes has been completed, the recording process for one wafer W is completed.

[Effect of First Embodiment]

The monitoring apparatus 20 according to a first embodiment described above is a monitoring apparatus of a doping/developing apparatus 2 including a holding unit 32 that holds a wafer W, and a processing liquid supply unit 40 that supplies a processing liquid to a surface Wa of the wafer W held by the holding unit 32 by discharging the processing liquid from a nozzle 42. The monitoring apparatus 20 includes: an imaging apparatus 110 capable of capturing an image of the nozzle 42 and the surface Wa of the wafer W held by the holding unit 32; a monitoring data generation unit 136 that generates monitoring video data based on the imaging video data MV0 by the imaging apparatus 110 during the execution of the wafer W process by the coating/developing apparatus 2 including a first process and a second process; and a monitoring condition changing unit 13 that changes a generation condition of the monitoring video data during the execution of the wafer W process so that at least the resolution or the number of frames of the monitoring video data (second video data MV2) during the execution of the second process is different from that of the monitoring video data (first video data MV1) during the execution of the first process.

The monitoring procedure of the coating/developing apparatus 2 described above includes: capturing an image of the nozzle 42 and the surface Wa of the wafer W held by the holding unit 32 by the imaging apparatus 110; generating monitoring video data based on the imaging video data MV0 by the imaging apparatus 110 during the execution of the wafer W process by the coating/developing apparatus 2 including the first process and the second process; and changing the generation condition of the monitoring video data during the execution of the wafer W process so that at least the resolution or the number of frames of second video data MV2 during the execution of the second process is different from that of first video data MV1 during the execution of the first process.

It is conceivable to automatically monitor the wafer W by a computer using an image process in order to determine (confirm) the state of the unit process of the wafer W in the liquid processing unit U1. Various unit processes of the wafer W are performed in the liquid processing unit U1. Video data of high image quality may be required to monitor (confirm) the state of a part of the unit processes. Therefore, it is conceivable to determine the state of various unit processes of the wafer W by setting a plurality of cameras at the optimum positions according to the content of the unit process of the wafer W and acquiring plural pieces of video data having image quality suitable for the content of the unit process. However, in this case, the number of cameras increases, which causes the configuration of the imaging apparatus to be complicated. Meanwhile, it is conceivable to simplify the configuration of the imaging apparatus by capturing an image with one camera to include the execution state of various unit processes of the wafer W. However, in this case, the imaging range becomes wider than when a plurality of cameras is installed at the optimum positions. When video data of high image quality is acquired according to the process that requires higher image quality and an image process is performed using the video data for each of various unit processes of the wafer W, the processing load of the computer becomes larger.

In the above-described monitoring apparatus 20 and monitoring procedure, the generation condition of the monitoring video data is changed during the execution of the wafer W process so that at least the resolution or the number of frames of the second video data MV2 during the execution of the second process is different from that of the first video data MV1 during the execution of the first process. Therefore, it is possible to generate monitoring video data of high image quality in a process that requires high image quality, and to generate monitoring video data of low image quality in a process that is sufficient even when the image quality is low. That is, the image quality of the monitoring video data may be changed according to the processing content. Therefore, the above-described monitoring apparatus 20 and monitoring procedure are useful for reducing the processing load of a computer when monitoring the process of the wafer W based on the imaging video.

The monitoring condition changing unit 138 may change a generation condition during the execution of the wafer W process so that the size of the imaging region PR of all pixels of the monitoring video data during the execution of the second process is different from that of the monitoring video data during the execution of the first process. In this case, it is possible to reduce the size of the imaging region PR in all pixels in the monitoring video data during the execution of the process that requires high image quality. Therefore, it is more useful for reducing the processing load of a computer when monitoring the process of the wafer W based on the imaging video.

The monitoring condition changing unit 138 may change the reduction rate in the number of pixels per unit area from the imaging video data during the execution of the wafer W process so that the resolution of the monitoring video data during the execution of the second process is different from that of the monitoring video data during the execution of the first process. The monitoring data generation unit 136 may generate monitoring video data by reducing the number of pixels from the imaging video data MV0 according to the reduction rate changed by the monitoring condition changing unit 138. In this case, since the reduction rate in the number of pixels per unit area differs in the first process and the second process, monitoring data of image quality suitable for the processing content may be easily obtained.

The first process may be a process of moving the nozzle 42, and the second process may be a process of discharging the processing liquid from the nozzle 42 to the surface Wa of the wafer W. The monitoring condition changing unit 138 may change a generation condition during the execution of the wafer W process so that the resolution of the monitoring video data during the execution of the second process is different from that of the monitoring video data during the execution of the first process. Video data of low image quality may be sufficient for monitoring the nozzle arrangement process, and video data of high image quality may be required for monitoring the supplying process. With the above-mentioned configuration, it is possible to obtain monitoring video data suitable for the processing content in the nozzle arrangement process and the supplying process. Further, by reducing the size of the imaging region PR included in all pixels in the monitoring video data of the supplying process, an amount of data may be reduced even when the resolution is high. In this case, it is possible to achieve both an appropriate monitoring of the wafer W process and a reduction of the processing load of the computer.

The first process may be a process of forming a film of the processing liquid on the surface Wa of the wafer W, and the second process may be a process of discharging the processing liquid from the nozzle 42 to the surface Wa of the wafer W. The monitoring condition changing unit 138 may change a generation condition during the execution of the wafer W process so that the resolution of the monitoring video data during the execution of the second process becomes higher than that of the monitoring video data during the execution of the first process. Video data of high image quality may be sufficient for monitoring the film formation process, and video data of high image quality may be required for monitoring the supplying process. With the above-mentioned configuration, it is possible to obtain monitoring video data suitable for the processing content in the drying process and the supplying process.

The monitoring apparatus 20 described above may further include a monitoring condition storage unit 148 that stores a condition changing schedule for changing a generation condition according to the processing schedule of the wafer W by the coating/developing apparatus 2. The monitoring condition changing unit 138 may change a generation condition during the execution of the wafer W process based on the condition changing schedule. In this case, when changing the generation condition, since the condition schedule in the monitoring condition storage unit 148 may be referred to, the processing load required for changing the generation condition may be reduced.

The monitoring apparatus 20 described above may further include a process determination unit 150 that determines an abnormality in the wafer W process based on the monitoring video data, a storage data recording that records storage video data based on the imaging video data MV0, and a storage condition changing unit 154 that changes a storage condition of the storage video data to a time when the storage video data is recorded when the determination result of the process determination unit 150 indicates an abnormality. In the configuration, when the determination result indicates an abnormality, it is possible to store the video data of the image quality suitable for such a result. The configuration is useful for both an analysis of abnormality using the storage video data and a suppression of the increase in recording capacity by, for example, improving the image quality of the unit process period in which an abnormality has occurred in the storage video data as compared to other periods in which no abnormality has occurred.

When the determination result of the process determination unit 150 indicates an abnormality, the storage condition changing unit 154 may change at least one of the resolution, the number of frames, and the compression format of the storage video data to a time when recording the storage video data. In this case, it is possible to record the period in which an abnormality has occurred in the storage video data with higher image quality than the other periods in which no abnormality has occurred. Therefore, the configuration is useful for both an analysis of abnormality using the storage video data and a suppression of the increase in recording capacity.

When the determination result of the process determination unit 150 indicates an abnormality, the storage data recording unit 152 may also record processing information indicating the processing content of the wafer W determined to be abnormal. In this case, when analyzing the abnormality using the storage video data, it is easy to grasp the processing content when the process in which the abnormality has occurred in is executed.

In the above-described monitoring apparatus 20, by reducing the processing load of the computer, for example, real-time monitoring (determination) of the processing state of the wafer W becomes possible. It is also possible to simplify the configuration of the liquid processing unit U1 by monitoring the contents of a plurality of unit processes with one camera.

(Modification of First Embodiment)

The change condition schedule stored in the monitoring condition storage unit 148 is generated by the monitoring condition generation unit 142, but may be created in advance by the operator instead of the monitoring condition generation unit 142.

The monitoring condition changing unit 138 may change a generation condition during the execution of the wafer W process based on the processing schedule of the wafer W and the correspondence information stored in the reference condition storage unit 140. Specifically, each time the unit process of the wafer W is switched, the monitoring condition changing unit 138 acquires a signal indicating the content of the unit process from the processing information storage unit 120. Then, by referring to the table information stored in the reference condition storage unit 140, the monitoring condition changing unit 138 acquires the generation condition according to the content of the unit process each time the unit process of the wafer W is switched, and changes the acquired generation condition to the generation condition.

The monitoring apparatus 20 according to the present modification includes a reference condition storage unit 140 that stores correspondence information in which the processing content of the wafer W and the generation condition are associated with each other. The monitoring condition changing unit 138 may change the generation condition during the execution of the wafer W process based on the processing schedule of the wafer W by the coating/developing apparatus 2 and the correspondence information. In this case, when the coating/developing apparatus 2 executes the wafer W process according to plural types of processing schedules, it is not necessary to prepare plural change condition schedules in advance. Therefore, it is useful for reducing the storage capacity of the control apparatus 100.

The monitoring condition changing unit 138 may change the generation condition so that the target region IR is set to the periphery of the nozzle and the target region IR is changed according to the movement locus of the nozzle 42 in the arrangement process of the nozzle 42. In this case, the control apparatus 100 may include an image processing unit that calculates the movement locus of the nozzle 42 based on the imaging video data acquired by the data acquisition unit 132. Alternatively, the monitoring condition changing unit 138 may adjust the target region IR to the movement locus of the nozzle 42 according to the information indicating the movement of the nozzle 42 defined in the processing schedule (information in which the time and the position are associated with each other).

[Second Embodiment]

Next, a control apparatus 100 provided in a substrate processing system 1 according to a second embodiment will be described with reference to FIGS. 3 and 13. The control apparatus 100 according to the second embodiment is different from the control apparatus 100 according to the first embodiment in that a method of changing the resolution adjusts the imaging optical system of an imaging apparatus 110. The imaging apparatus 110 includes an imaging optical system 112 illustrated in FIG. 3. The monitoring condition changing unit 138 changes a zoom magnification by the imaging optical system 112 of the imaging apparatus 110 during the execution of the wafer W process so that the resolution of second video data MV2, which is the monitoring video data during the execution of the second process, is different from that of first video data MV1, which is the monitoring video data during the execution of the first process.

Figure 13:
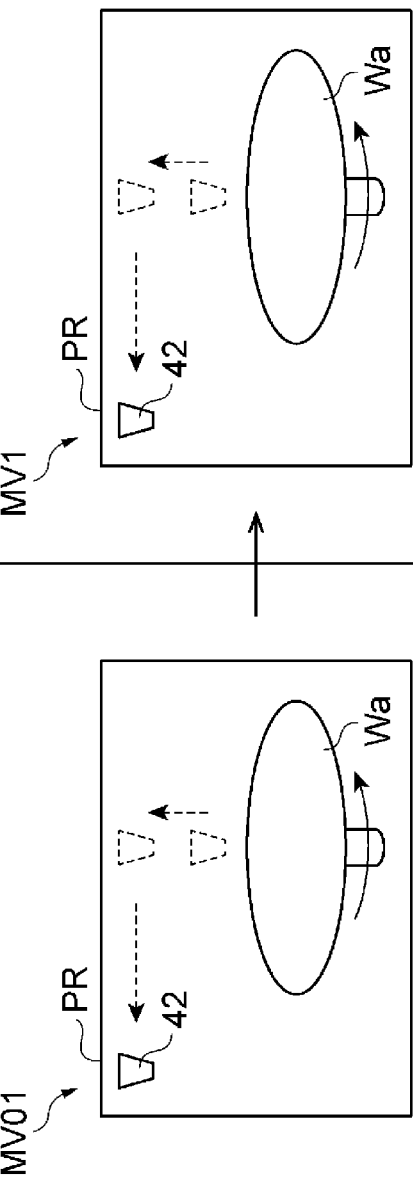
FIG. 13 is a schematic diagram illustrating an example of generation of monitoring video data in a second embodiment.

For example, when the first process is a drying process and the second process is a process of supplying a processing liquid, as illustrated in FIG. 13, the monitoring condition changing unit 138 sets the zoom magnification of the imaging apparatus 110 in the first process to 1. In this case, the imaging region PR of the imaging video data MV01 acquired by the data acquisition unit 132 includes, for example, a moving nozzle 42 and the entire surface Wa of the wafer W. Meanwhile, the monitoring condition changing unit 138 sets the zoom magnification of the imaging apparatus 110 in the second process to x (x is a value larger than 1) times, and adjusts the imaging optical system 112 of the imaging apparatus 110 so that the entire nozzle 42 at the discharge position is within the angle of view. At this time, the monitoring condition changing unit 138 sets the number of pixels to the same value as the number of pixels in the first process. In this case, the imaging region PR of the imaging video data MV02 acquired by the data acquisition unit 132 includes, for example, a nozzle 42 at the discharge position and a part of the surface Wa of the wafer W.

The monitoring data generation unit 136 may generate monitoring video data by using the first video data MV1 as it is without performing a process such as a compression on the imaging video data MV01. The monitoring data generation unit 136 also does not perform the ROI selection process from the imaging region PR of the imaging video data MV01. In the imaging video data MV01 and the first video data MV1, the resolution, the number of frames, and the size of the imaging region PR in all pixels are the same as each other (e.g., the image sizes of both data are VGA size and the number of frames of both data is 60 fps). The monitoring data generation unit 136 may generate monitoring video data by using the second video data MV2 as it is without performing a process such as a compression on the imaging video data MV02. The monitoring data generation unit 136 also does not perform the ROI selection process from the imaging region PR of the imaging video data MV02. In the imaging video data MV02 and the second video data MV2, the resolution, the number of frames, and the size of the imaging region PR in all pixels are the same as each other (e.g., the image sizes of both data are VGA size and the number of frames of both data is 60 fps).

The number of pixels per unit area (the total number of pixels) in the imaging video data MV01 and the imaging video data MV02 is the same as each other. However, since the zoom magnifications are different, the resolutions, which are the sizes of the imaging region PR per pixel, are different from each other. Therefore, the resolutions of the first video data MV1 and the second video data MV2 are also different from each other. By changing the zoom magnification in this way, the monitoring condition changing unit 138 changes the generation condition during the execution of the wafer W process so that the resolution of the second video data MV2 is higher than the resolution of the first video data MV1.

The imaging apparatus 110 may be configured such that the direction or position of a camera is changed. In addition to the zoom magnification, the monitoring condition changing unit 138 may change the generation condition (imaging region of imaging video data) by changing the direction or position of the camera according to the content of the unit process. In the arrangement process of the nozzle 42, the monitoring condition changing unit 138 may change the direction or position of the camera so that the imaging region matches the movement locus of the nozzle 42. The reference condition storage unit 140 may store the correspondence information in which the content of the unit process and the zoom magnification included in the generation condition are associated with each other.

In the monitoring apparatus 20 according to the second embodiment described above, the monitoring condition changing unit 138 may change the zoom magnification by the imaging optical system 112 of the imaging apparatus 110 during the execution of the wafer W process so that the resolution of the monitoring video data (second video data MV2) during the execution of the second process is different from that of the monitoring video image data (first video data MV1) during the execution of the first process. The monitoring data generation unit 136 may generate monitoring video data based on the imaging video data MV0 captured by the imaging apparatus 110 at the zoom magnification changed by the monitoring condition changing unit 138.

Also in this case, as in the first embodiment, it is useful for reducing the processing load of the computer. For example, when in a unit process that requires high image quality and a unit process that does not require high image quality, the imaging video data captured without using the optical zoom is used as the monitoring video data as it is, it is necessary to always capture images with high image quality according to the process that requires high image quality. As a result, even in the process that does not require high image quality, monitoring is required to perform an image process with monitoring video data of high image quality. By enlarging and capturing the imaging region with an optical zoom in a process that requires high image quality, an amount of monitoring video data may be reduced as compared to always capturing the entire image with high image quality and the processing load of the computer may be reduced. Further, in the above-described configuration, since a computer process for adjusting the image quality may be omitted, it is more useful for reducing the processing load of the computer as compared with the first embodiment.

The monitoring condition changing unit 138 may change the generation condition by combining at least one of the process of changing the number of pixels per unit area, the process of changing the number of frames, and the process of selecting the target region IR according to the first embodiment with the process of changing the zoom magnification of the imaging apparatus 110 according to the second embodiment.

In the liquid process including the developing process in the liquid processing unit U1 of the processing module 14, the control apparatus 100 may monitor the process of the wafer W in the same manner as in the first embodiment and the second embodiment described above. In this case, in the drying process, the liquid processing unit U1 may form a puddle of developer on the surface Wa while the wafer W to which the developer is applied (supplied) on the surface Wa is stopped. For example, the monitoring apparatus 20 may monitor whether the puddle is properly formed.

The substrate to be processed is not limited to a semiconductor wafer, and may be, for example, a glass substrate, a mask substrate, or a flat panel display (FPD).

DESCRIPTION OF SYMBOLS

1: substrate processing system
2: coating/developing apparatus
20: monitoring apparatus
30: rotation holding unit
40: processing liquid supply unit
100: control apparatus
136: monitoring data generation unit
138: monitoring condition changing unit
140: reference condition storage unit
142: monitoring condition generation unit
148: monitoring condition storage unit
150: process determination unit
152: storage data recording unit
154: storage condition changing unit
U1: liquid processing unit

What is claimed is:
1. A monitoring apparatus for a substrate processing apparatus, the monitoring apparatus comprising:
   a camera configured to capture an image of a nozzle of the substrate processing apparatus and a surface of a substrate held by a substrate holder of the substrate processing apparatus;
   a monitoring data generation circuitry configured to generate monitoring video data based on imaging video data captured by the camera during an execution of a substrate process performed by the substrate processing apparatus including a first process and a second process; and
   a monitoring condition changing circuitry configured to change a generation condition of the monitoring video data during the execution of the substrate process so that at least a resolution or a number of frames of the monitoring video data during an execution of the second process is different from the monitoring video data during an execution of the first process.

2. The monitoring apparatus according to claim 1, wherein the monitoring condition changing circuitry changes the generation condition during the execution of the substrate process so that a size of an imaging region of all pixels of the monitoring video data during the execution of the second process is different from the monitoring video data during the execution of the first process.

3. The monitoring apparatus according to claim 1, wherein the monitoring condition changing circuitry changes a reduction rate in a number of pixels per unit area from the imaging video data during the execution of the substrate process so that the resolution of the monitoring video data during the execution of the second process is different from the monitoring video data during the execution of the first process, and
   the monitoring data generation circuitry generates the monitoring video data by reducing the number of pixels from the imaging video data according to the reduction rate changed by the monitoring condition changing circuitry.

4. The monitoring apparatus according to claim 1, wherein the monitoring condition changing circuitry changes a zoom magnification by an imaging optical system of the camera during the execution of the substrate process so that the resolution of the monitoring video data during the execution of the second process is different from the monitoring video data during the execution of the first process, and
   the monitoring data generation circuitry generates the monitoring video data based on the imaging video data captured by the camera at the zoom magnification changed by the monitoring condition changing circuitry.

5. The monitoring apparatus according to claim 1, wherein the first process is a process of moving the nozzle,
   the second process is a process of discharging the processing liquid from the nozzle to the surface of the substrate, and
   the monitoring condition changing circuitry changes the generation condition during the execution of the substrate process so that the resolution of the monitoring video data during the execution of the second process is higher than the resolution of the monitoring video data during the execution of the first process.

6. The monitoring apparatus according to claim 1, wherein the first process is a process of forming a film of the processing liquid on the surface of the substrate,
   the second process is a process of discharging the processing liquid from the nozzle to the surface of the substrate, and
   the monitoring condition changing circuitry changes the generation condition during the execution of the substrate process so that the resolution of the monitoring video data during the execution of the second process is higher than the resolution of the monitoring video data during the execution of the first process.

7. The monitoring apparatus according to claim 1, further comprising:
a monitoring condition storage configured to store a condition changing schedule for changing the generation condition according to a processing schedule of the substrate by the substrate processing apparatus,
wherein the monitoring condition changing circuitry changes the generation condition during the execution of the substrate process based on the condition changing schedule.

8. The monitoring apparatus according to claim 1, further comprising:
a reference condition storage configured to store correspondence information in which a content of the substrate process and the generation condition are associated with each other,
wherein the monitoring condition changing circuitry changes the generation condition during the execution of the substrate process based on the processing schedule of the substrate by the substrate processing apparatus and the correspondence information.

9. The monitoring apparatus according to claim 1, further comprising:
an abnormality determination circuitry configured to determine an abnormality in the substrate process based on the monitoring video data;
a storage data recording circuitry configured to record storage video data based on the imaging video data; and
a storage condition changing circuitry configured to change a storage condition of the storage video data to a time when the storage video data is recorded, when a determination result of the abnormality determination circuitry indicates the abnormality.

10. The monitoring apparatus according to claim 9, wherein, when the determination result of the abnormality determination circuitry indicates the abnormality, the storage condition changing circuitry changes at least one of a resolution, a number of frames, and a compression format of the storage video data to a time when the storage video data is recorded.

11. The monitoring apparatus according to claim 9, wherein, when a determination result of the abnormality determination circuitry indicates an abnormality, the storage data recording circuitry also records processing information indicating a content of the substrate process determined to be abnormal.

12. A substrate processing apparatus comprising:
a substrate holder configured to hold a substrate;
a processing liquid supply including a nozzle and configured to supply a processing liquid to a surface of the substrate held by the substrate holder by discharging the processing liquid from the nozzle;
a camera configured to capture an image of the nozzle and the surface of the substrate held by the substrate holder;
a monitoring data generation circuitry configured to generate monitoring video data based on imaging video data captured by the camera during an execution of a substrate process including a first process and a second process; and
a monitoring condition changing circuitry configured to change a generation condition of the monitoring video data during the execution of the substrate process so that at least a resolution or a number of frames of the monitoring video data during an execution of the second process is different from the monitoring video data during an execution of the first process.

13. A method of monitoring a substrate processing apparatus, the method comprising:
capturing an image of a nozzle of the substrate processing apparatus and a surface of a substrate held by a substrate holder by a camera;
generating monitoring video data based on imaging video data captured by the camera during an execution of a substrate process by the substrate processing apparatus including a first process and a second process; and
changing a generation condition of the monitoring video data during the execution of the substrate process so that at least a resolution or a number of frames of the monitoring video data during an execution of the second process is different from the monitoring video data during an execution of the first process.

14. A computer-readable storage medium that stores therein a program for causing an apparatus to execute the method according to claim 13.

15. The method according to claim 13, further comprising;
changing the generation condition during the execution of the substrate process so that a size of an imaging region of all pixels of the monitoring video data during the execution of the second process is different from the monitoring video data during the execution of the first process.

16. The method according to claim 13, further comprising:
changing a reduction rate in a number of pixels per unit area from the imaging video data during the execution of the substrate process so that the resolution of the monitoring video data during the execution of the second process is different from the monitoring video data during the execution of the first process; and
generating the monitoring video data by reducing the number of pixels from the imaging video data according to the reduction rate.

17. The method according to claim 13, further comprising:
changing a zoom magnification by an imaging optical system of the camera during the execution of the substrate process so that the resolution of the monitoring video data during the execution of the second process is different from the monitoring video data during the execution of the first process; and
generating the monitoring video data based on the imaging video data captured by the camera at the zoom magnification.

18. The method according to claim 13, wherein the first process is a process of moving the nozzle,
the second process is a process of discharging the processing liquid from the nozzle to the surface of the substrate, and
the monitoring method further comprises changing the generation condition during the execution of the substrate process so that the resolution of the monitoring video data during the execution of the second process is higher than the resolution of the monitoring video data during the execution of the first process.

19. The method according to claim 13, wherein the first process is a process of forming a film of the processing liquid on the surface of the substrate,
the second process is a process of discharging the processing liquid from the nozzle to the surface of the substrate, and
the monitoring method further comprises changing the generation condition during the execution of the substrate process so that the resolution of the monitoring video data during the execution of the second process is higher than the resolution of the monitoring video data during the execution of the first process.

20. The method according to claim 13, further comprising:
   storing a condition changing schedule for changing the generation condition according to a processing schedule of the substrate by the substrate processing apparatus; and
   changing the generation condition during the execution of the substrate process based on the condition changing schedule.

\* \* \* \* \*